United States Patent [19]
Aitken et al.

[11] Patent Number: 6,159,787
[45] Date of Patent: Dec. 12, 2000

[54] STRUCTURES AND PROCESSES FOR REDUCED TOPOGRAPHY TRENCH CAPACITORS

[75] Inventors: John M. Aitken, South Burlington; Alvin W. Strong, Essex Junction, both of Vt.

[73] Assignee: International Business Machines Corporation, Armonk, N.Y.

[21] Appl. No.: 09/086,403

[22] Filed: May 28, 1998

[51] Int. Cl.[7] .............................................. H01L 21/8242
[52] U.S. Cl. ........................ 438/243; 438/386; 257/522
[58] Field of Search .................. 438/239, 243, 438/248, 386, 391, 424, 957, 21, 50, 171, 210, 238; 257/522, 301; 365/149

[56] References Cited

U.S. PATENT DOCUMENTS

| | | |
|---|---|---|
| 4,035,820 | 7/1977 | Matzen . |
| 4,419,812 | 12/1983 | Topich . |
| 4,958,318 | 9/1990 | Harari . |
| 5,339,212 | 8/1994 | Geffken et al. . |
| 5,350,705 | 9/1994 | Brassington et al. . |
| 5,352,622 | 10/1994 | Chung . |
| 5,536,672 | 7/1996 | Miller et al. . |
| 5,541,427 | 7/1996 | Chappell et al. . |
| 5,550,078 | 8/1996 | Sung . |
| 5,583,356 | 12/1996 | Yoon et al. . |
| 5,585,998 | 12/1996 | Kotecki et al. . |
| 5,903,493 | 5/1999 | Lee ........................................... 365/149 |
| 5,994,181 | 11/1999 | Hsieh et al. ............................. 438/239 |
| 6,016,000 | 1/2000 | Moslehi .................................. 257/522 |

*Primary Examiner*—Matthew Smith
*Assistant Examiner*—Calvin Lee
*Attorney, Agent, or Firm*—Ratner & Prestia; Tiffany L. Townsend

[57] ABSTRACT

A trench capacitor for use with a substrate. The capacitor has an inner electrode formed above the substrate. The inner electrode has a plurality of metal layers, a dielectric partially surrounding the inner electrode, and an outer electrode partially surrounding the dielectric.

11 Claims, 36 Drawing Sheets

FIG. 6A
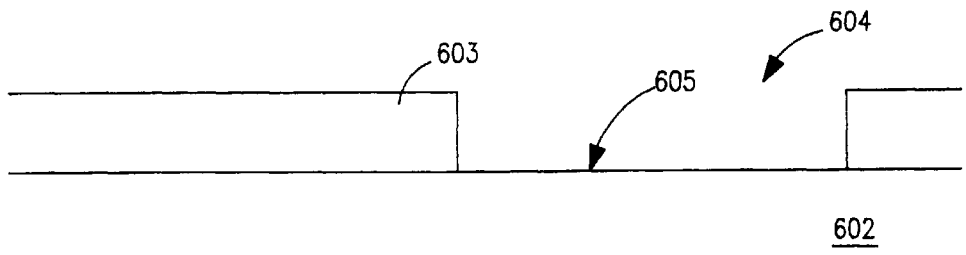
FIG. 6B
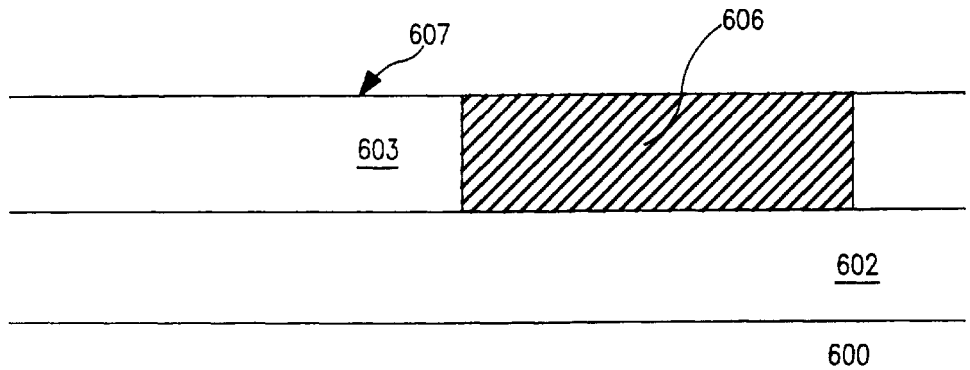
FIG. 6C

STRUCTURES AND PROCESSES FOR REDUCED TOPOGRAPHY TRENCH CAPACITORS

TECHNICAL FIELD

This invention relates generally to capacitor structures and, more particularly, to structures and processes for fabricating trench type capacitors in integrated circuit technology.

BACKGROUND OF THE INVENTION

Capacitors are an essential element in integrated circuit technology. They are used, for example, as storage nodes in dynamic random access memories (DRAMS), decoupling elements in fast switching logic chips, and filter elements in signal processing chips. Currently three main capacitor structures are used for the above mentioned applications.

One conventional capacitor structure is a planar capacitor. A typical planar capacitor is fabricated on a substrate, has an insulator layer and a conductive layer, and is known as a thin polysilicon gated capacitor. An example of a planar capacitor is described in U.S. Pat. No. 4,419,812. Formed in either the substrate or the metallization layers, planar capacitors have a drawback because they are essentially two dimensional and occupy a large area of the underlying structure.

Another capacitor structure is the trench capacitor, which is typically fabricated in the substrate. An example of a trench capacitor is described in U.S. Pat. No. 4,958,318. Conventional trench capacitors have several drawbacks. In particular, when formed in the substrate, a trench capacitor uses a significant percentage of the total processing cost and still occupies some critical area thereby decreasing the area available for other devices in the substrate, such as transistors. In addition, trench capacitors may cause dislocations in the substrate.

A third capacitor structure is the stacked capacitor, formed in the first levels of the metallization and insulator stacks. The typical stacked capacitor is formed in the first level of metallurgy and insulation in integrated circuit technology. The topography associated with stacked capacitors aggravates problems associated with forming contacts for these capacitors as well as integrating the capacitor with other connections within the substrate. Furthermore, when stacked capacitors are formed in the insulation layers above the substrate, although these capacitors may conserve active area in the substrate, this conservation results in an exaggerated three dimensional topography due to the attendant increase in the vertical dimension to achieve the necessary capacitance. Another drawback is that stacked capacitors require extensive processing steps to fabricate.

As shown in FIG. 1, the planar are occupied by capacitor 100 depends on the feature size F and the lithography used to define it. Thus, capacitors of minimum dimension with reduced topography and high capacitance are desired. In addition, it is desired that the size of reduced topography capacitors integrate easily into current device processing.

SUMMARY OF THE INVENTION

In view of the shortcomings of the prior art, it is an object of the present invention to form high capacitance integrated circuit elements which have minimal topography and are easily integrated into standard silicon processes.

The present invention relates to a trench capacitor for use with a substrate. The capacitor has an inner electrode having a plurality of metal layers, a dielectric partially surrounding the inner electrode, and an outer electrode partially surrounding the dielectric.

The present invention also relates to a process for forming a trench capacitor within an insulation layer above the substrate. The process comprises the steps of disposing an insulation layer over the substrate, forming a trench in the insulation layer, forming a first electrode along an interior surface of the trench, disposing a dielectric along an interior surface of the first electrode, and disposing a second electrode along at least a portion of the dielectric.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIGS. 6A–6H show cross sectional views of a capacitor according to a third exemplary embodiment of the present invention;

DETAILED DESCRIPTION OF THE INVENTION

Figure 1:
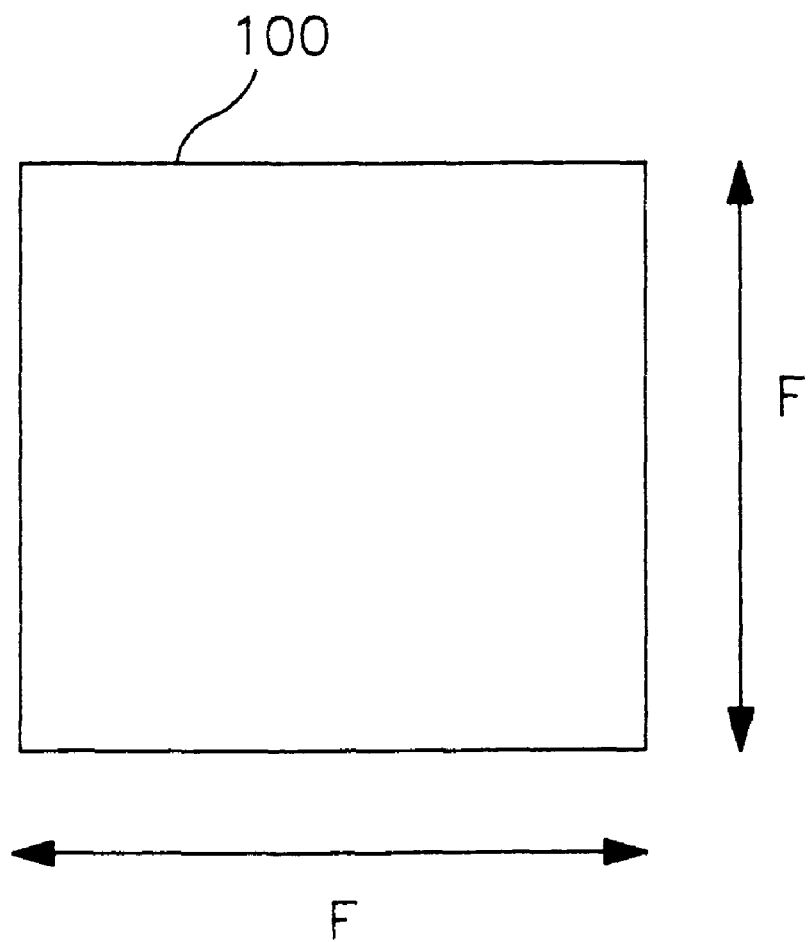
FIG. 1 shows a two dimension lithographic dimension.

Referring now to the drawing, FIGS. 2A–2D are a flowchart diagram of an exemplary embodiment of the present invention. The process shown in FIGS. 2A–2D is described below in conjunction with FIGS. 3A–3S.

Figure 3A:
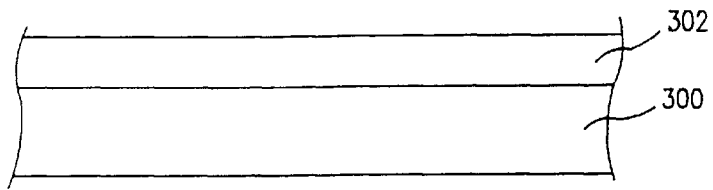
FIGS. 3A–3N and 3P–3S show cross sectional views of a capacitor formed according to the process of FIGS. 2A–2D.
Figure 3B:
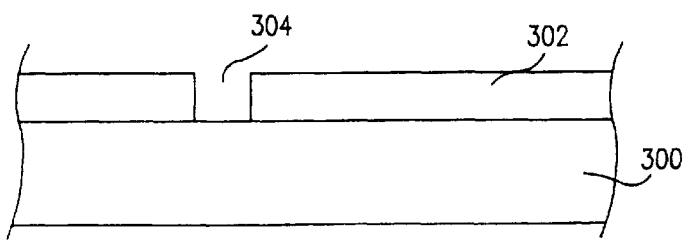
Figure 3C:
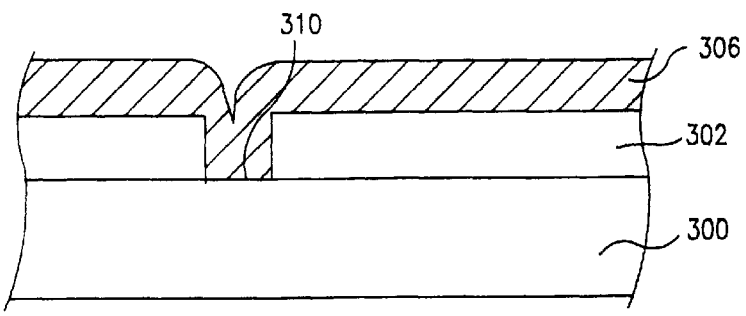
Figure 3D:
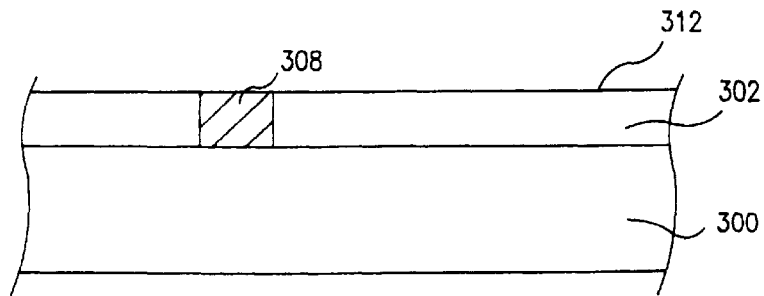
Figure 3E:
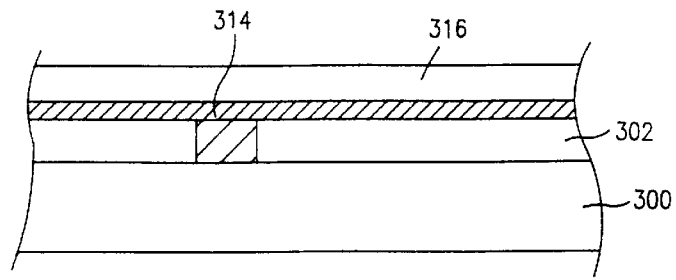
Figure 3F:
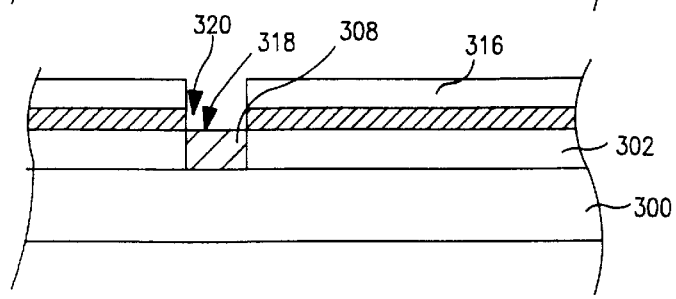
Figure 3G:
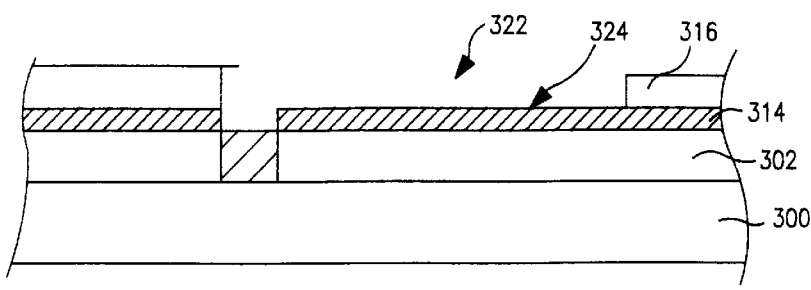
Figure 3H:
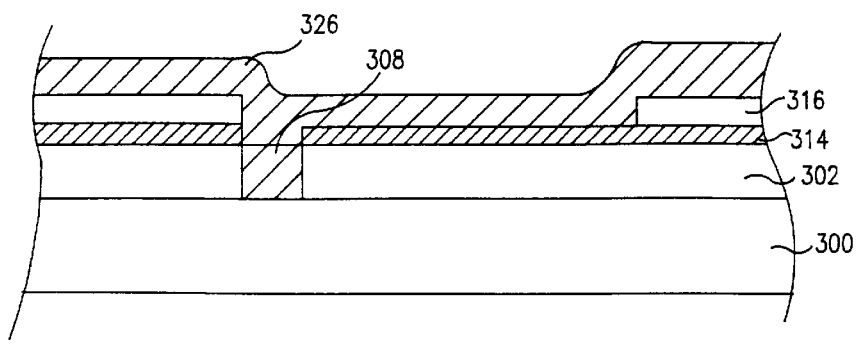
Figure 3I:
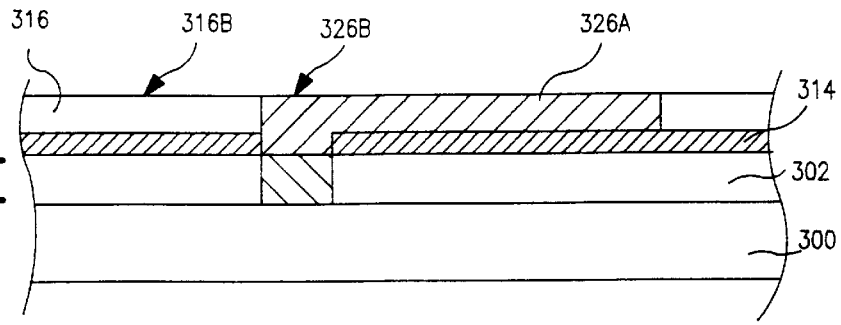
Figure 3J:
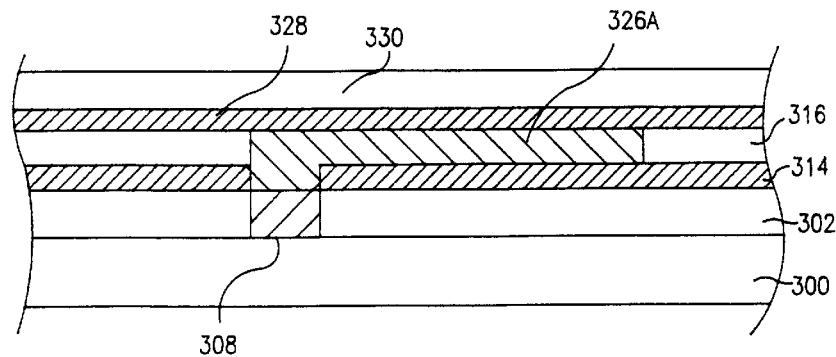
Figure 3K:
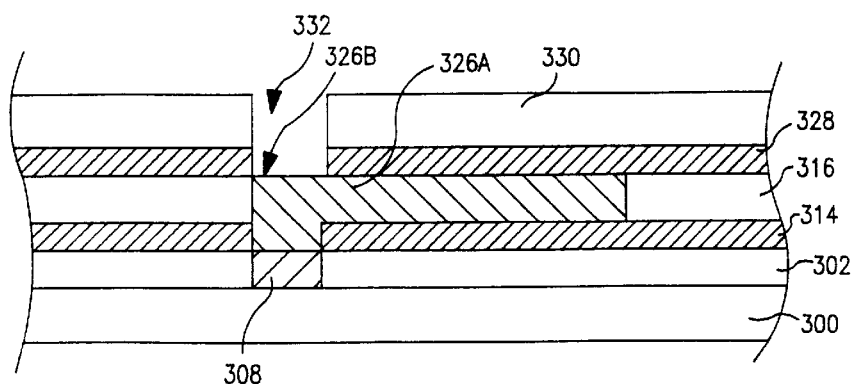
Figure 3L:
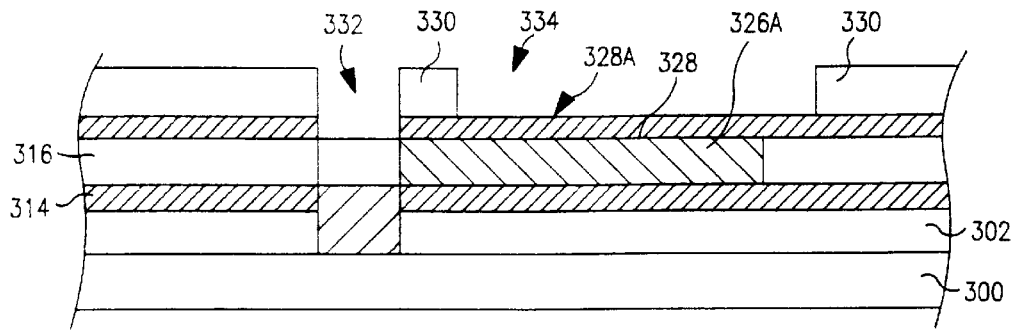
Figure 3M:
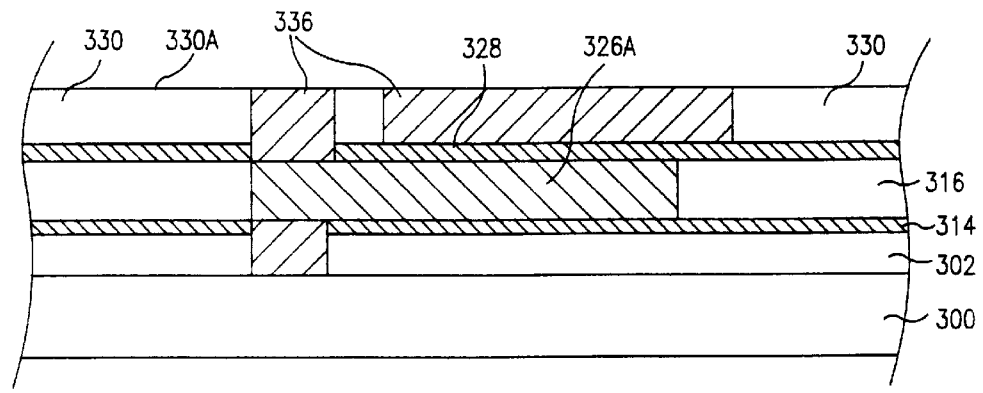
Figure 3N:
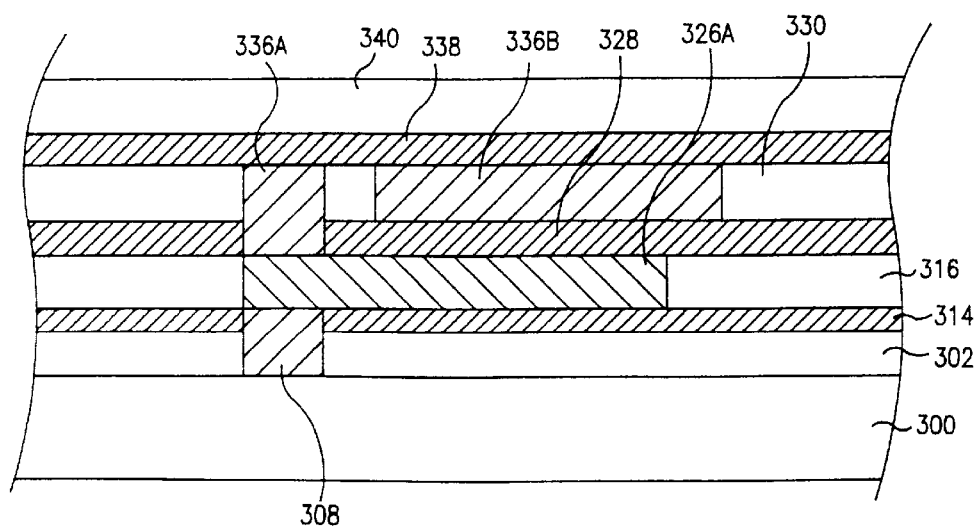
Figure 3P:
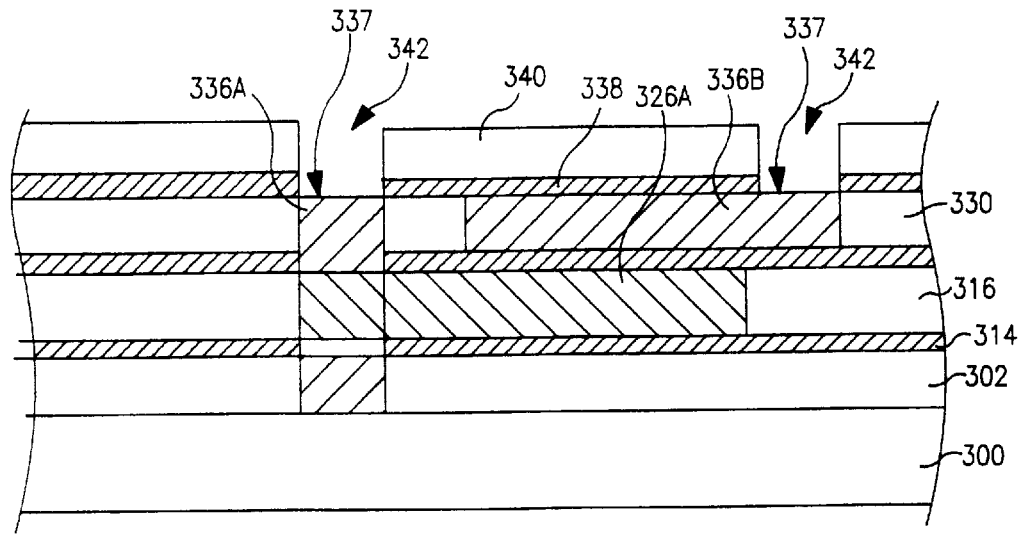
Figure 3Q:
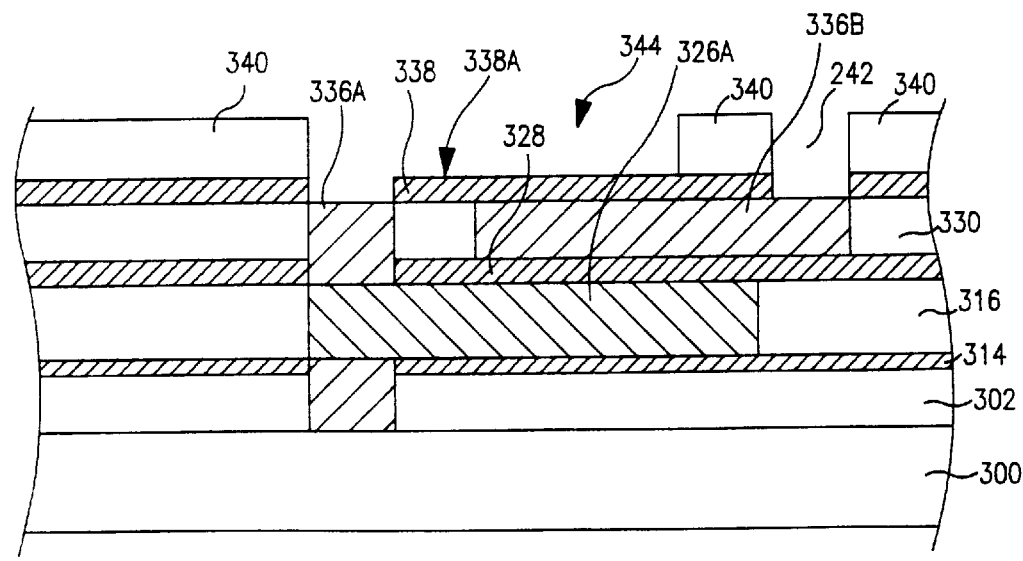
Figure 3R:
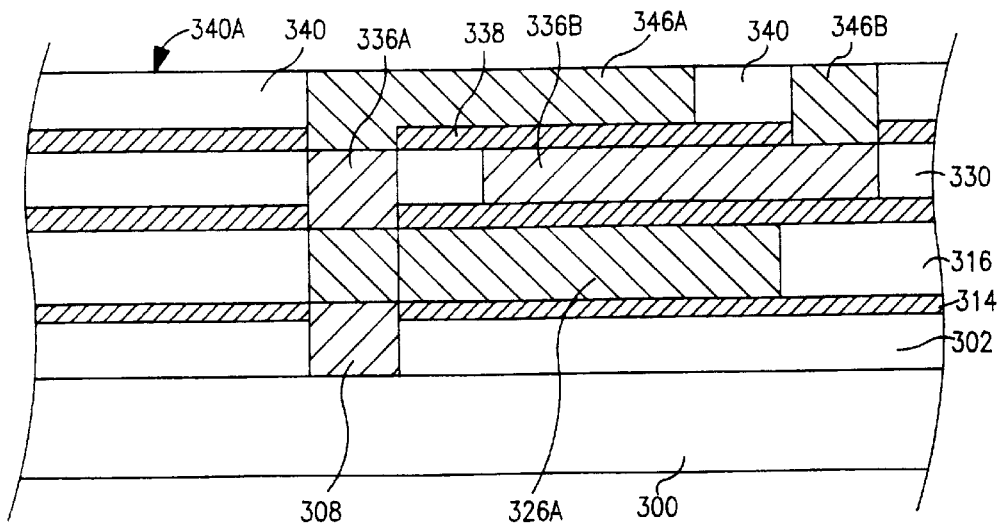
Figure 3S:
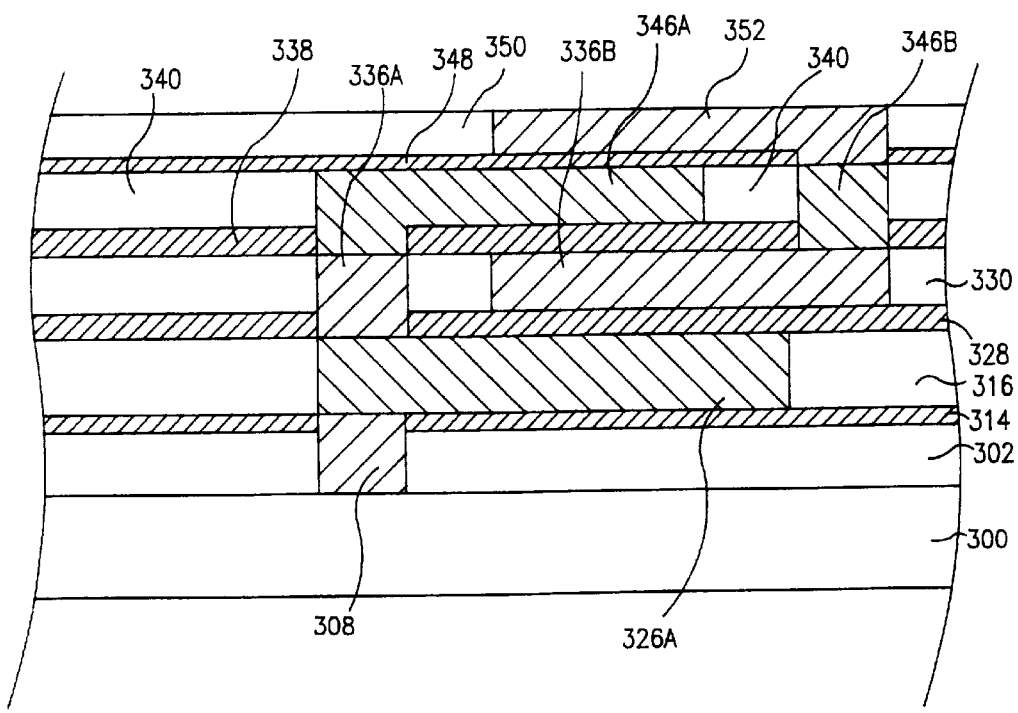

FIGS. 3A–3S are cross sectional views of a planarized interleaved capacitor constructed in accordance with an exemplary embodiment of the present invention.

Figure 2A:
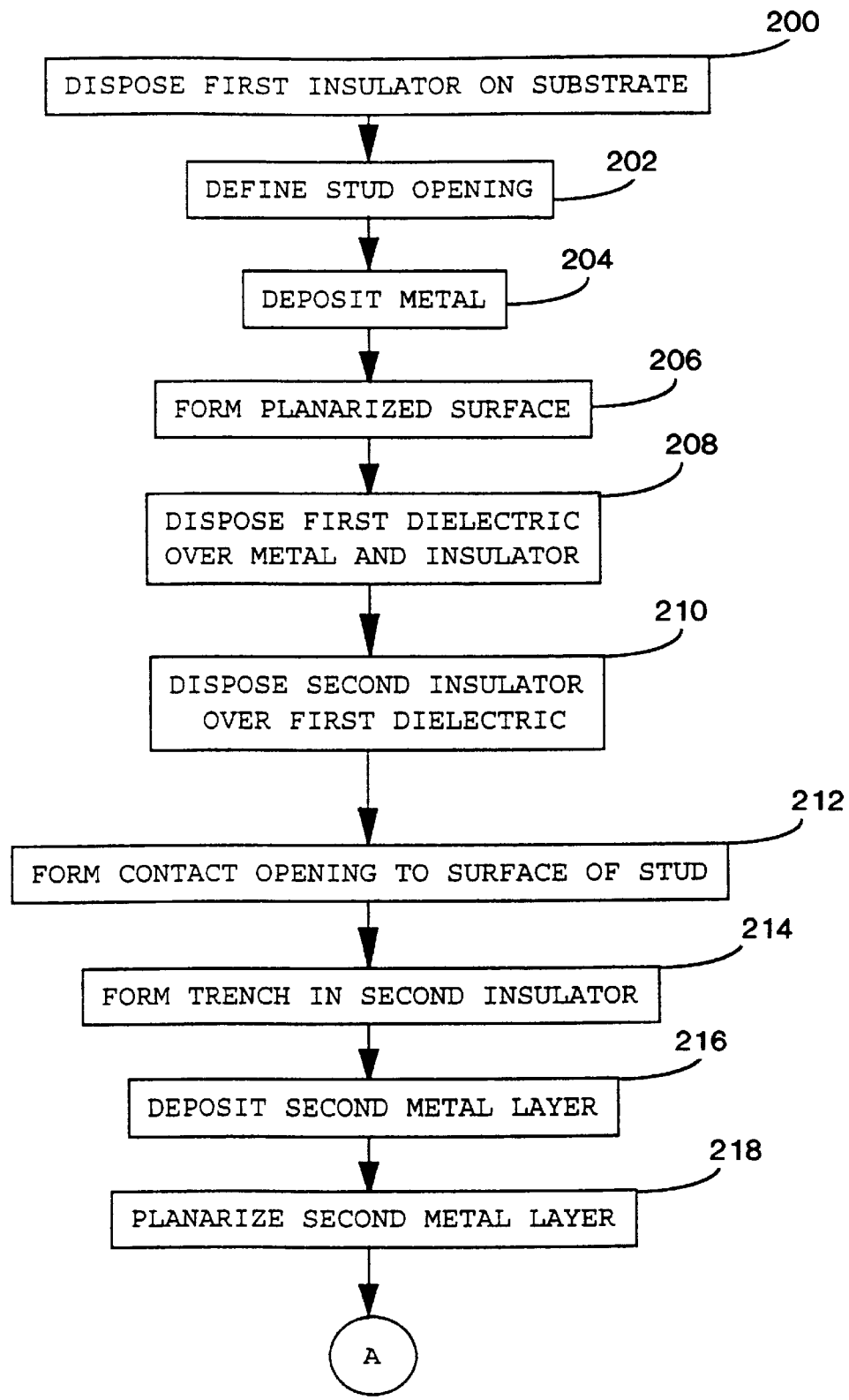
FIGS. 2A–2D are flow charts illustrating a process for forming a capacitor according to a first exemplary embodiment of the present invention.

Referring to FIGS. 2A and 3A, at Step 200, insulator 302 is formed over substrate 300. The substrate may also include underlying circuitry (not shown). An exemplary insulator 302 may be silicon dioxide ($SiO_2$), although other insulators may be used as desired.

At Step 202, stud opening 304 (shown in FIG. 3B) is formed in insulator 302. Opening 304 may be formed by a lithographic and etching process for example. At Step 204, metal 306 (shown in FIG. 3C) is disposed over insulator 302 and within stud opening 304. Metal 306 flows within stud opening 304 and contacts substrate 300 at surface 310. Surface 310 may be a connection point for the underlying circuitry of substrate 300. At Step 206, metal 306 (shown in FIG. 3D) is polished back or planarized to surface 312 of insulator 302 to form metal stud 308.

At Step 208, first dielectric layer 314 (shown in FIG. 3E) is uniformly formed over insulator 302 and metal stud 308. Silicon nitride ($Si_3N_4$) has a dielectric constant of about 7 and may be used to form dielectric layer 314, although other dielectric compounds may be used. The thickness of the dielectric layer may be on the order of 10 nanometers or less. In addition, at Step 210, insulator 316 is disposed over dielectric layer 314. At Step 212, opening 320 (shown in FIG. 3F) is formed in insulator 316 and dielectric layer 314 to expose surface 318 of metal stud 308. As mentioned above, lithographic etching or other methods may be used to form openings in the materials used in the exemplary embodiment.

At Step 214, an additional portion of insulator 316 is removed (shown in FIG. 3G) to expose area 322 to a top surface 324 of insulator 314. At Step 216, metal 326 (shown in FIG. 3H) is disposed over insulator 316, dielectric layer 314, and metal stud 308. Metal 326 forms an electrical contact with metal stud 308.

At Step 218, metal 326 is polished back or planarized (shown in FIG. 3I) to form metal level 326A. Reactive ion etching, chemical polishing, or mechanical polishing may be used to planarize, although other techniques may be used as desired. When metal 326 is planarized, a top surface 326B of metal level 326A will be planar with top surface 316B of insulator 316.

Figure 2B:
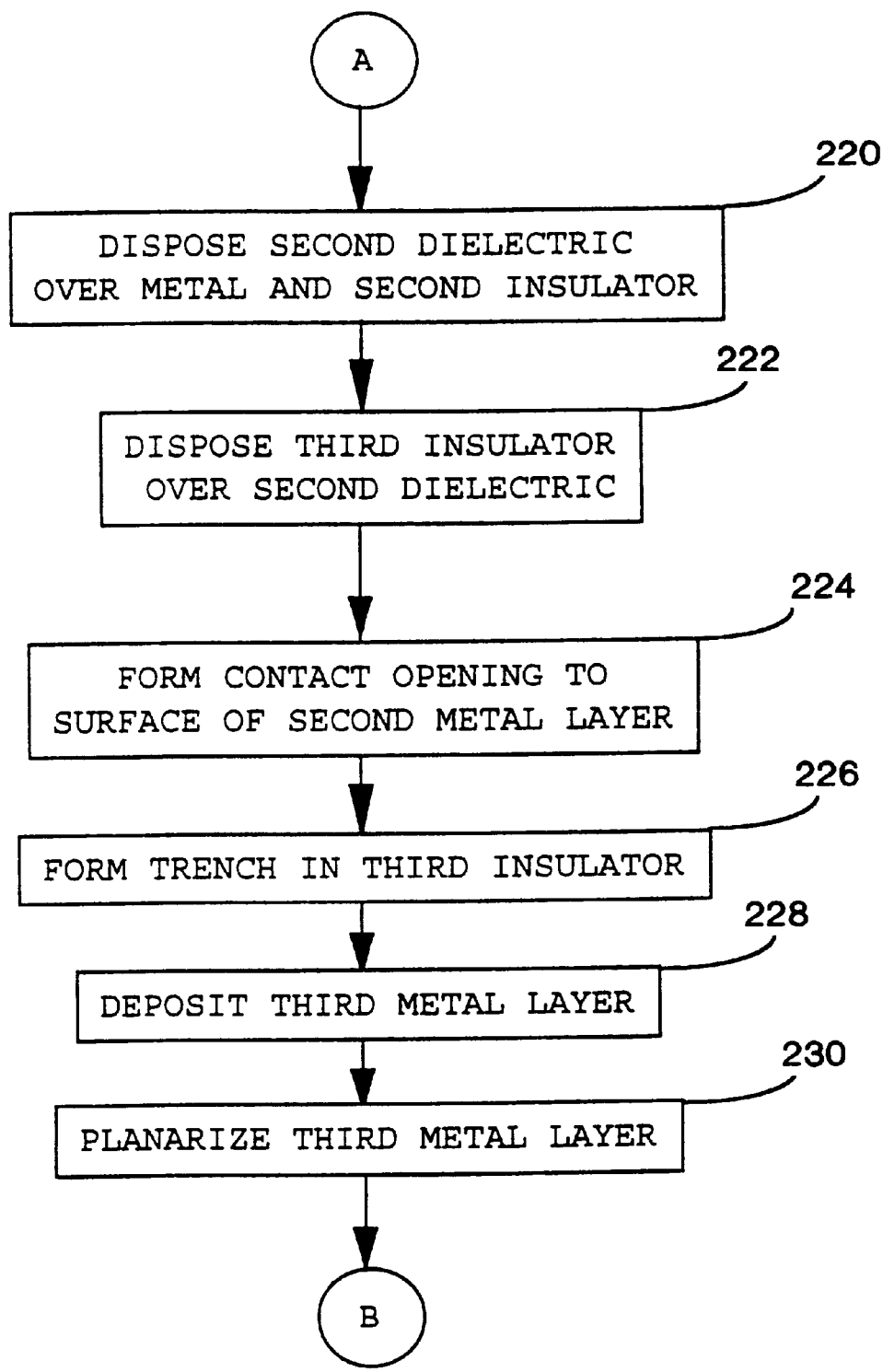

Referring to FIGS. 2B and 3J, at Step 220, dielectric 328 is disposed over metal level 326A and insulator 316. At Step 222, dielectric 328 is then planarized and insulator 330 is disposed over dielectric 328 and planarized. At Step 224, opening 332 is formed in insulator 330 and dielectric 328 to expose surface 326B of metal level 326A (shown in FIG. 3K). At Step 226, an additional portion of insulator 330 is removed to expose area 334 to a top surface 328A of insulator 328 (shown in FIG. 3L).

At Step 228, metal level 336 is formed over metal level 326A and dielectric 328 by disposing metal in opening 332 and area 334 followed by Step 230 to planarize the metal to the surface 330A of insulator 330 (shown in FIG. 3M). A portion of metal level 336 is in contact with metal level 326A while another portion of metal level 336 is separated form metal level 326A by dielectric layer 328. In this way metal level 336 serves the purposes of a) maintaining electrical integrity between odd numbered metal levels and b) forming the opposite plate of the capacitor.

Figure 2C:
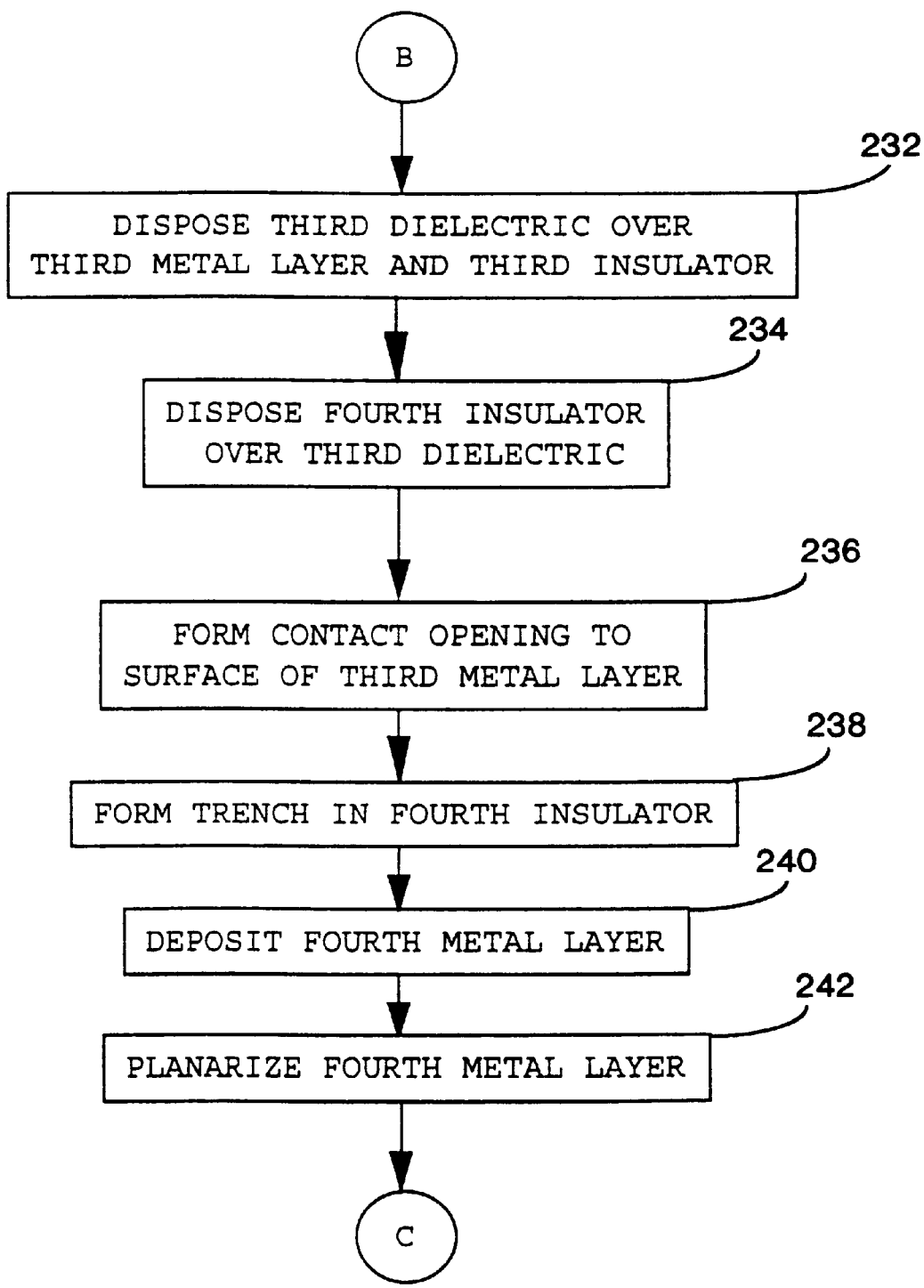

At Step 232, shown in FIG. 2C, dielectric 338 is disposed over metal level 336A, 336B and insulator 330. Dielectric 338 is then planarized. At Step 234, insulator 340 is disposed over dielectric 338 and planarized (shown in FIG. 3N). At Step 236, openings 342 are formed in insulator 340 and dielectric 338 to expose surface 337 of metal level 336A, 336B (shown in FIG. 3P). At Step 238, an additional portion of insulator 340 is removed to expose area 344 to a top surface 338A of insulator 338 (shown in FIG. 3Q).

At Step 240, metal level 346A and 346B is formed over metal level 336A and 336B, respectively, and dielectric 338 by disposing metal in openings 342 and area 344. At Step 242, metal level 346A, 346B is planarized to the surface 340A of insulator 340 (shown in FIG. 3R). As mentioned above, each succeeding metal level provides electrical integrity of lower metal levels while forming an opposing plate of the capacitor.

Figure 2D:
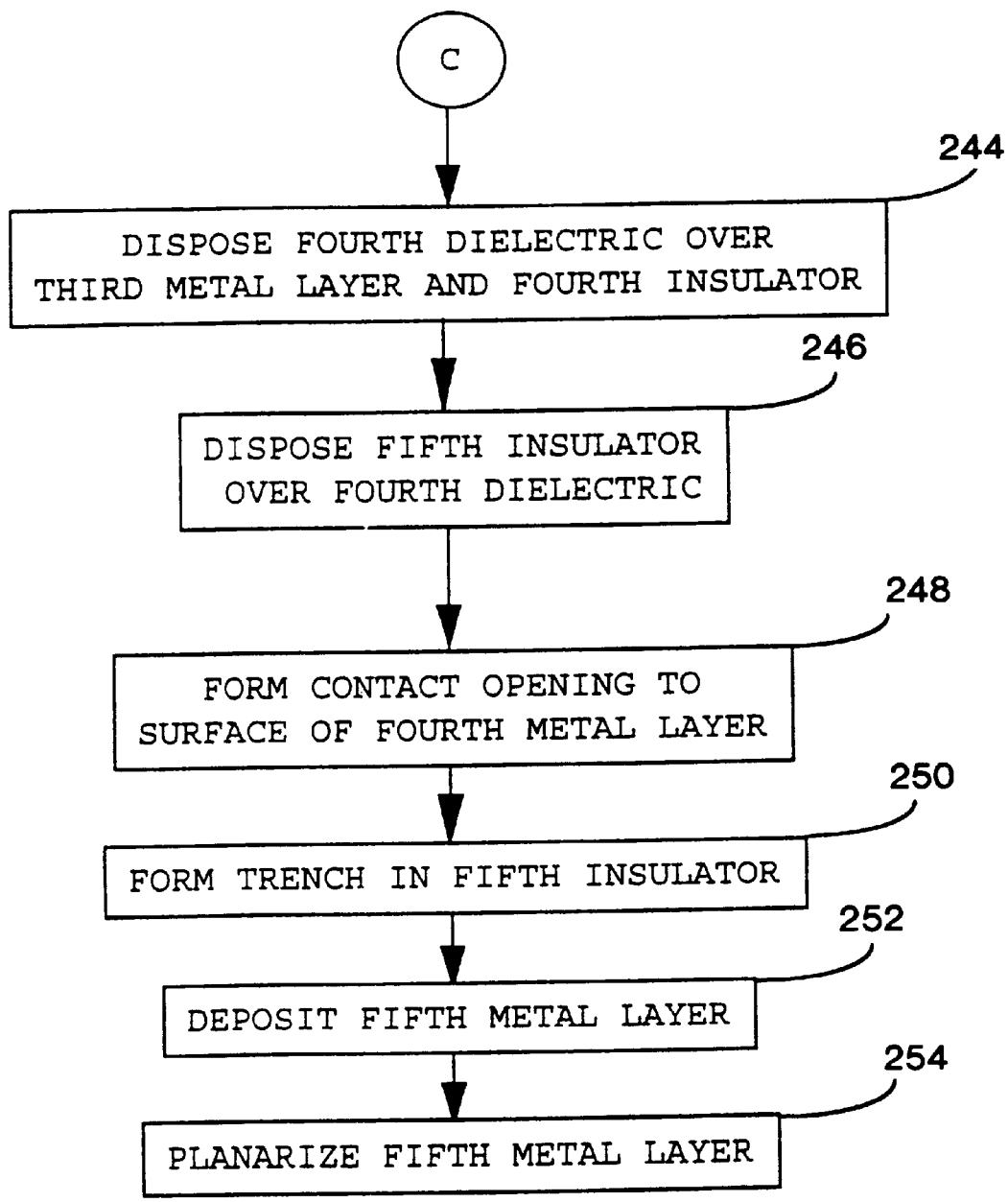

At Steps 244 through 254, shown in FIG. 2D, the procedure outlined above may be used to form as many levels as desired in order to provide a capacitor having a desired characteristic (shown in FIG. 3S). For example, in FIG. 3S, dielectric 348 is formed, followed by insulator 350 and metal level 352. As shown in FIG. 3S, the odd numbered metal layers 326A and 346A are electrically connected through the intervening even numbered metal layers 336A, and the even numbered metal layers 336B and 352 are electrically connected through the intervening odd numbered metal layer 346B.

As mentioned above the dielectric layers may be formed from $Si_3N_4$. As an alternative, the dielectric layers may be formed from the material used to form the insulation layers.

An advantage of an interleaved capacitor discussed above, and constructed in accordance with the present invention, is that the additional processing steps used to form the interleaved capacitor are known semiconductor processing steps. For example, metal layers and contacts are typically implemented when connections are made between elements in a substrate. Metal layers and contacts are already deposited on the substrate. Therefore, design requirements for an interleaved capacitor need only adjust the location or amount of metal levels for contact formation. In addition, the number of metal levels and metal contacts forming the capacitor, as well as the thickness and type of the dielectric, can be altered to achieve a desired capacitance for the structure. An exemplary dielectric has a thickness of about 10 nanometers or less and a dielectric constant of at least about 3.9.

Figure 4:
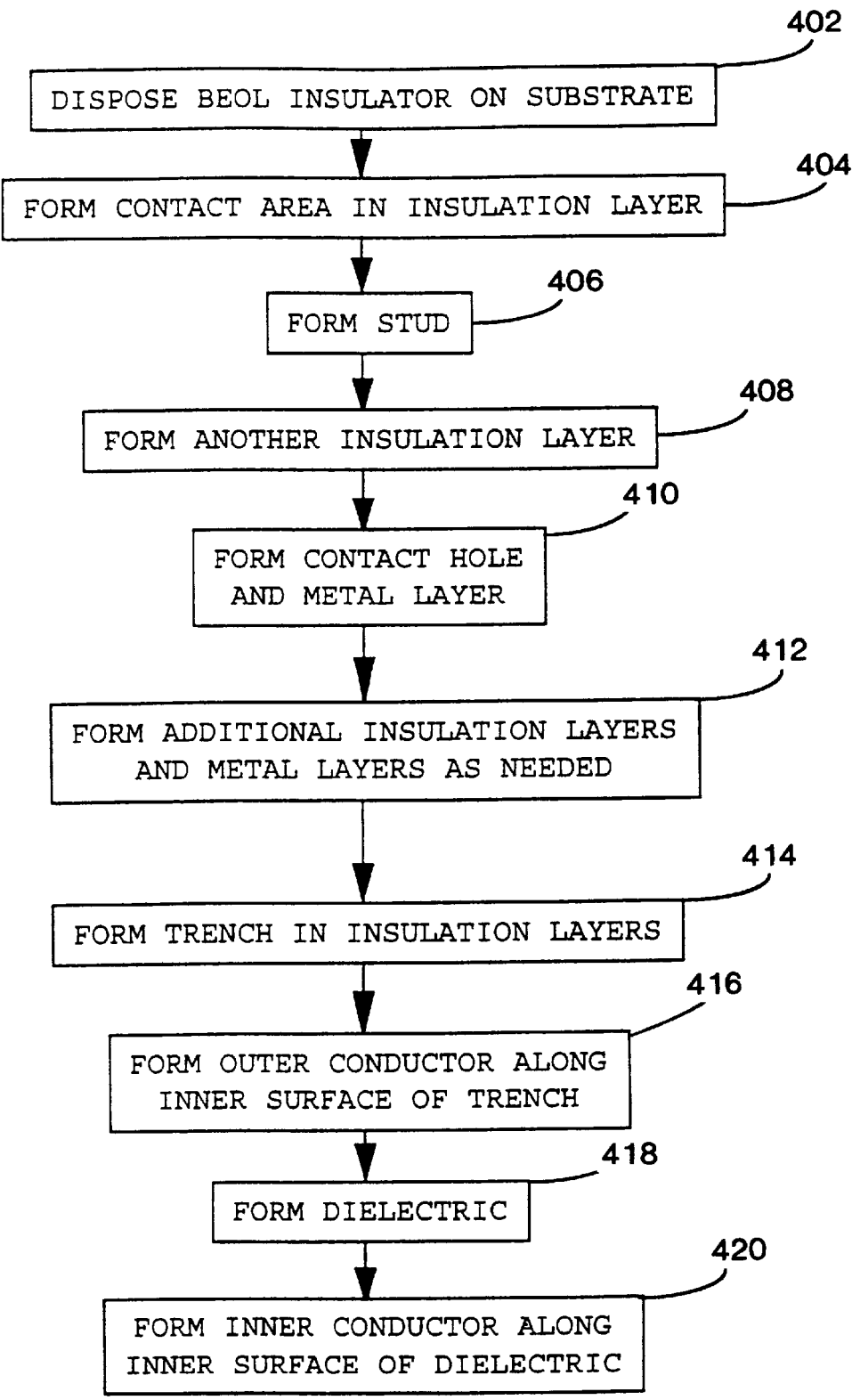
FIG. 4 is a flow chart illustrating a process for forming a capacitor according to a second exemplary embodiment of the present invention.

FIG. 4 is a flowchart diagram of a second exemplary embodiment of the present invention. The process shown in FIG. 4 is described below in conjunction with FIGS. 5A–5H.

Figure 5A:
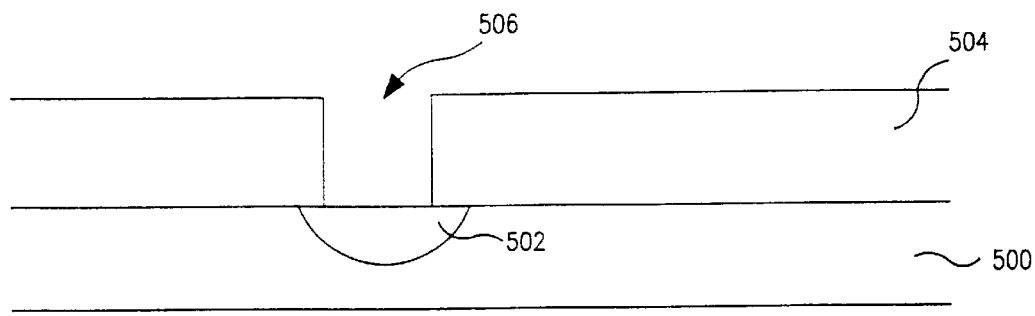
FIGS. 5A–5I show cross sectional views of a capacitor formed according to the process of FIG. 4.
Figure 5B:
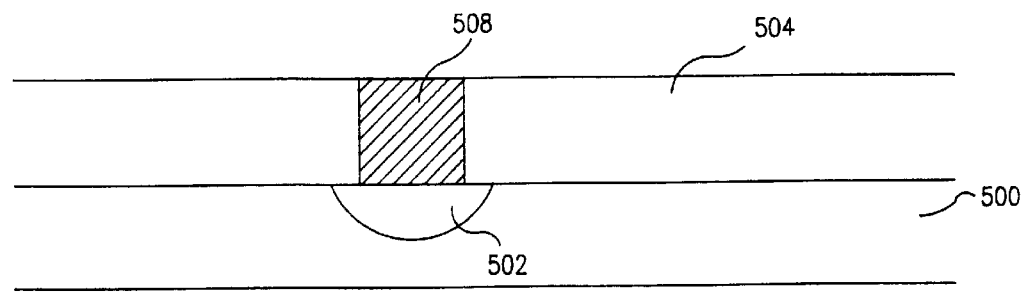

FIGS. 5A–5H are cross sectional views of a trench capacitor constructed in accordance with a second exemplary embodiment of the present invention. Referring to FIGS. 4 and 5A, at Step 402, a back-end-of-line (BEOL) insulation layer 504 is disposed over substrate 500. At Step 404, contact area 506 is formed in insulation layer 504 over diffusion 502 in substrate 500. Contact area 506 may be formed for example by chemical etching, a mechanical process or reactive ion etching (RIE). At Step 406, stud 508 is formed in contact area 506 so that it contacts diffusion 502 (shown in FIG. 5B).

Figure 5C:
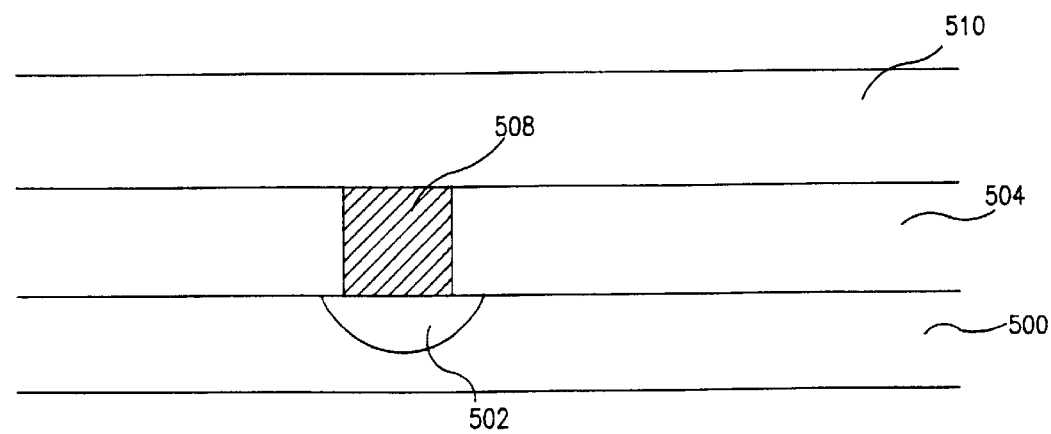
Figure 5D:
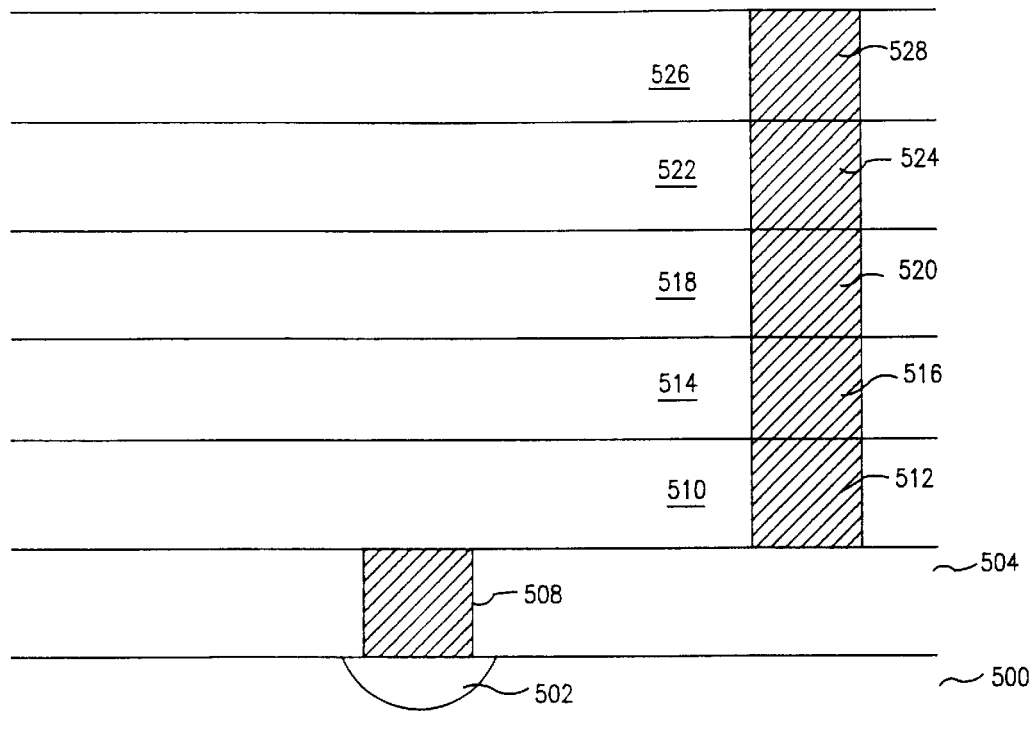
Figure 5E:
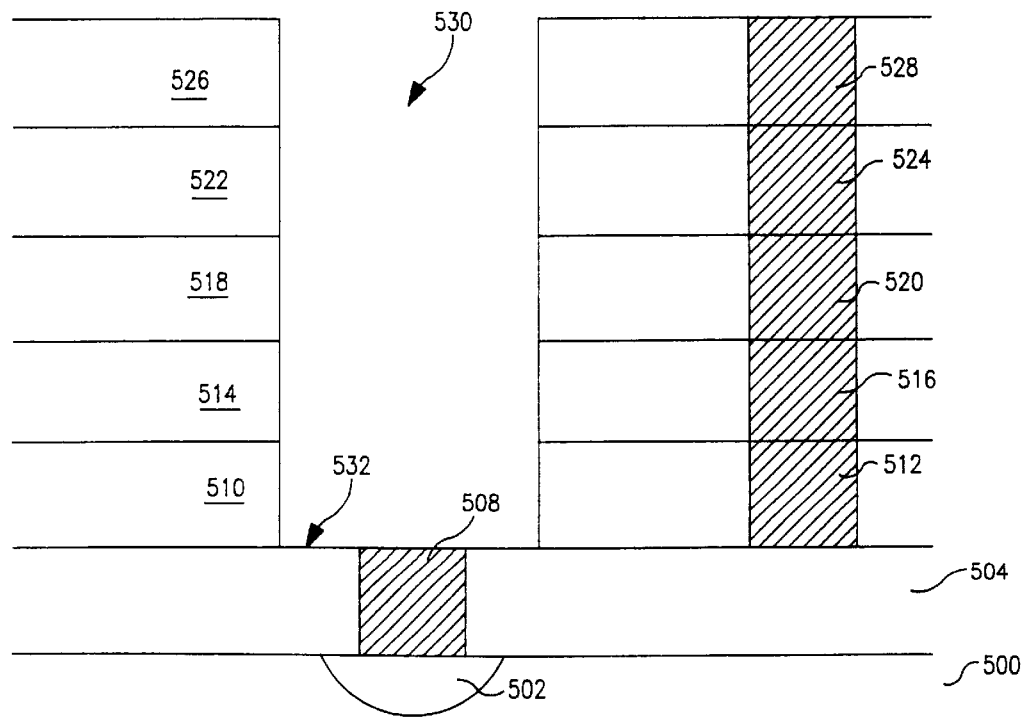
Figure 5F:
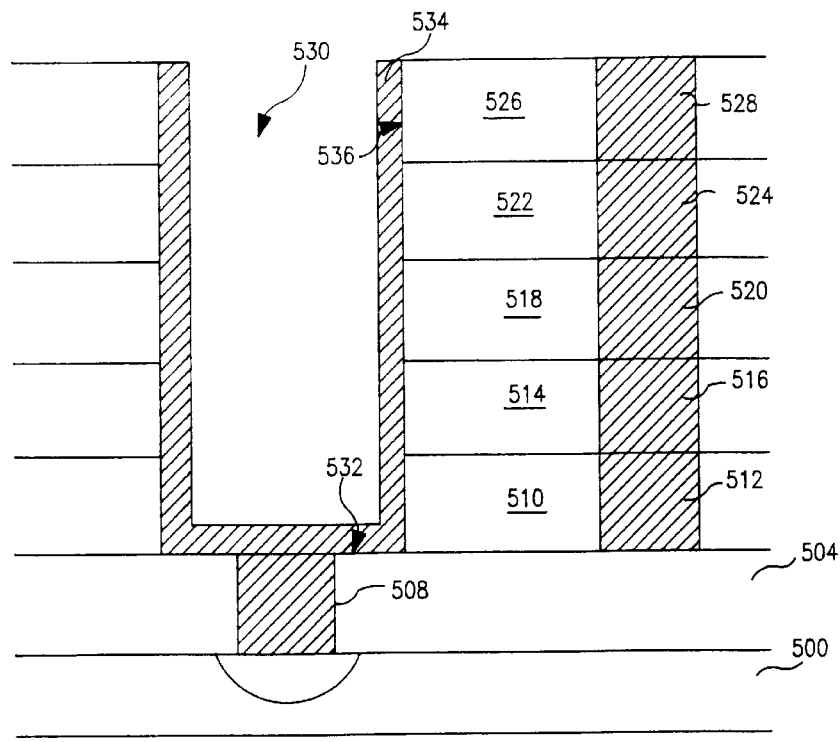
Figure 5G:
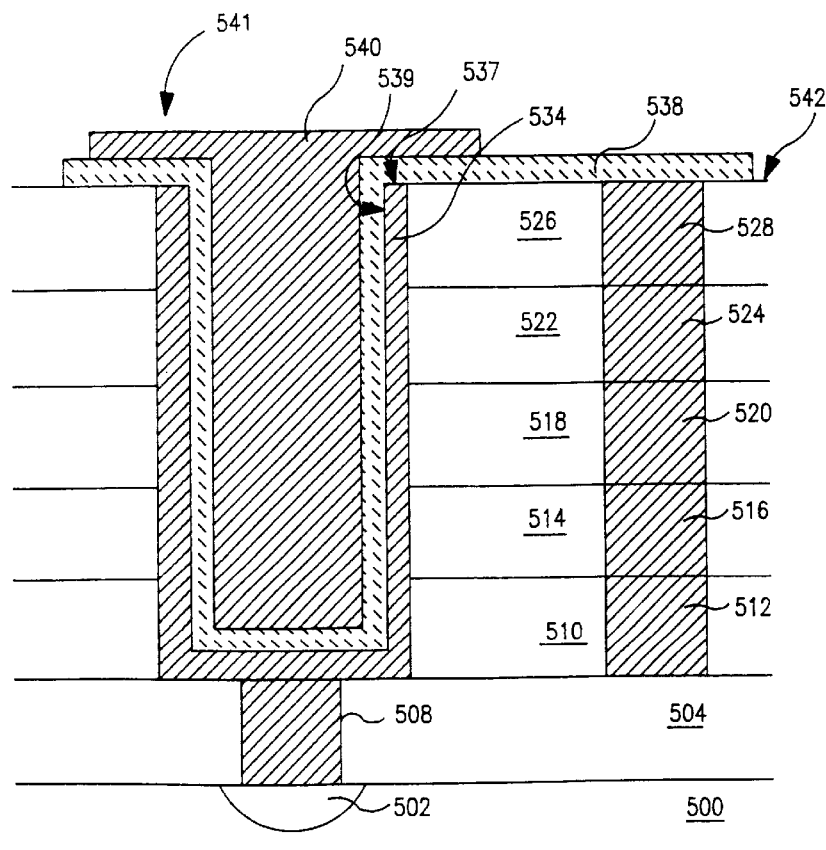

At Step 408, insulation layer 510 is formed above insulation layer 504 and stud 508 (shown in FIG. 5C). At Step 410, metal layer 512 is formed in insulation layer 510 by forming a contact hole to expose the top surface of insulation layer 504 and disposing a metal in the contact hole as mentioned above in Steps 404 and 406. In this case, however, the contact hole is not formed over diffusion 502. At Step 412, additional insulation layers 514, 518, 522, and 526 may be formed as desired along with respective metal layers 516, 520, 524 and 528 (shown in FIG. 5D). The number of layers formed may vary based on the desired capacitance or other design considerations.

At Step 414, trench 530 is formed in insulation layers 510, 514, 518, 522, and 526 and over the area of stud 508. As mentioned above, trench 530 may be formed using mechanical or chemical processing or RIE, for example. The bottom 532 of trench 530 is coincident with the top surface of stud 508 and insulation layer 504 (shown in FIG. 5E). At Step 416, conductor 534 is formed along inner surface 536 and bottom surface 532 of trench 530 (shown in FIG. 5F). Conductor 534 contacts stud 508 and may be made of any conductive compound or material.

At Step 418, dielectric 538 is formed along the inner wall 539 of conductor 534. Dielectric 538 is selected to provide a desired capacitance. Dielectric 538 may also overlap the upper surface 537 of conductor 534 as well as upper surface 542 of insulation layer 526. In addition, dielectric 538 may contact metal layer 528 if necessary. At Step 420, conductor 540 is formed within the remaining area of trench 530 and in contact with dielectric 538 to form a second plate of capacitor 541 (shown in FIG. 5G). Thus, capacitor 541 is formed by mutual capacitance between conductor 540 and conductor 534 through dielectric 538. A connection (not shown) to conductor 540 may be made to connect capacitor 541 between the connection and other devices contained within or above substrate 500.

Figure 5I:
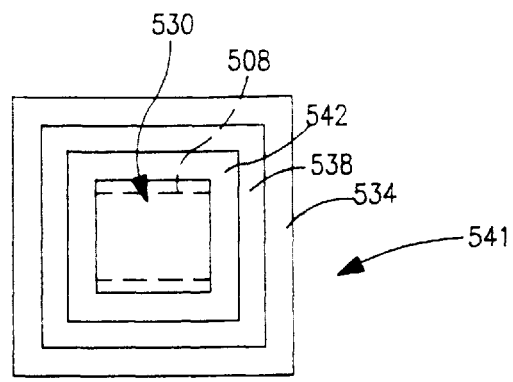
Figure 5H:
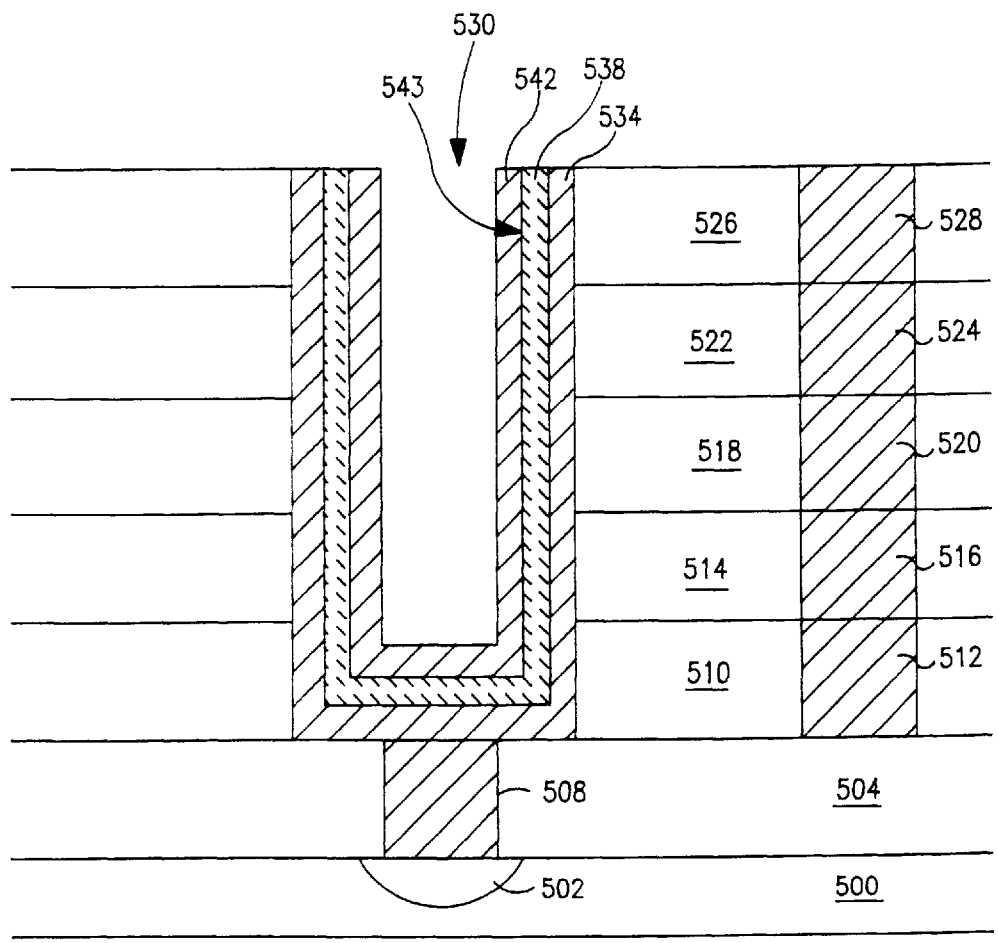

Referring to FIG. 5H, another embodiment of the trench capacitor is shown. This embodiment is similar to the embodiment mentioned above except that conductor 542 is uniformly formed along inner wall 543 of dielectric 538. The remaining area of trench 530 may be filled with an insulation material (not shown) to prevent contamination of trench 530 and capacitor 541.

Referring to FIG. 5I, a top view of capacitor 541 is shown. Capacitor 541 is in the shape of a square, for example, although other shapes, such as circles, rectangles, and triangles may be used as necessary.

Typically, a few microns of insulator thickness is sufficient to provide adequate capacitance for a trench capacitor in most applications. Presently, three to six metal levels are formed and the resulting structure has sufficient height as a medium in which to form the trench. Insulation layers 504, 510, 514, 518, 522, and 526 may be present on substrate 500 as a result of forming metal interconnections on substrate 500 or may be deposited as a medium in which to form the trench capacitor. Insulation layers 504, 510, 514, 518, 522, and 526 preferably have a relative dielectric constant approximately equal to 3.9 or greater, for example. Insulation layers 504, 510, 514, 518, 522, and 526 appropriately isolate exposed circuitry (not shown), for example, on substrate 500. As mentioned above, stud 508 preferably connects trench capacitor 541 to the substrate circuitry, as represented by diffusion 502.

The height of the capacitor and the thickness and type of the dielectric can be varied to achieve a desired capacitance for the structure. An exemplary structure has a square cross-section of about 0.5 micron on a side, a depth of about 3 microns into the insulation layers 510, 514, 518, 522, and 526, and dielectric 538 having a thickness of about 10 nanometers and a dielectric constant of about 7 or more. The resulting capacitance of such a trench structure is about 34 femto-farads (fF).

In addition, the capacitor of the present embodiment may not damage the substrate because the etch implant and temperature processes normally associated with conventional trench capacitors are unnecessary.

Figure 6D:
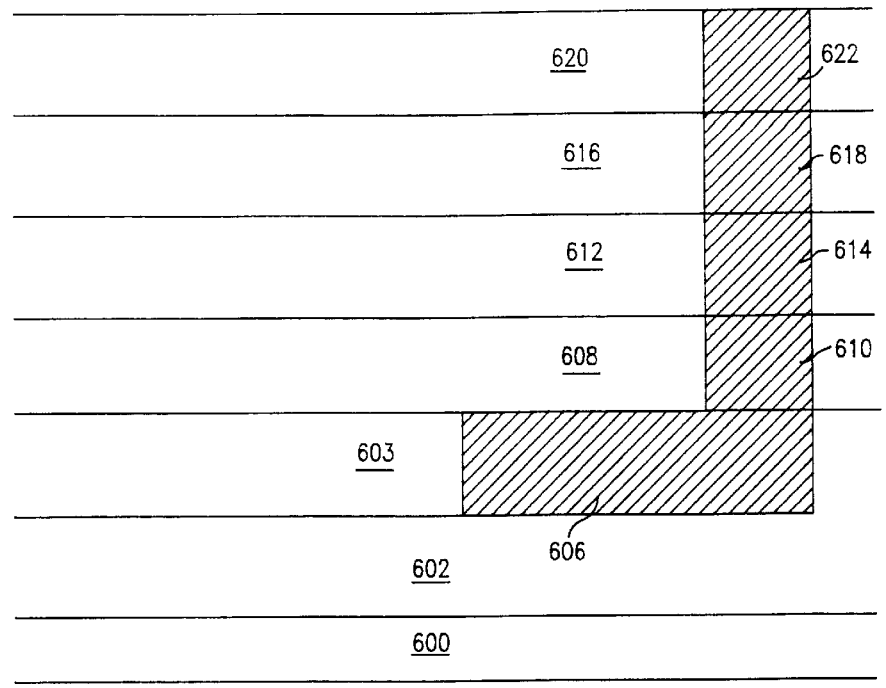

Referring to FIGS. 6A–6H, another exemplary embodiment of a trench capacitor of the present invention is shown. In FIG. 6A, BEOL insulation layer 602 is formed over substrate 600. Insulation layer 602 may have metal studs (not shown) within the insulation layer if necessary to provide connections between layers. In FIG. 6B, insulation layer 603 is formed over insulation layer 602 and contact area 604 is formed in insulation layer 603 by any conventional process, such as RIE, a mechanical process or chemical etching. Contact area 604 has a bottom surface 605 coincident with a top surface of insulation layer 603. In FIG. 6C, metal contact 606 is formed in contact area 604 and polished or planarized to be even with surface 607 of insulation layer 603.

Figure 6E:
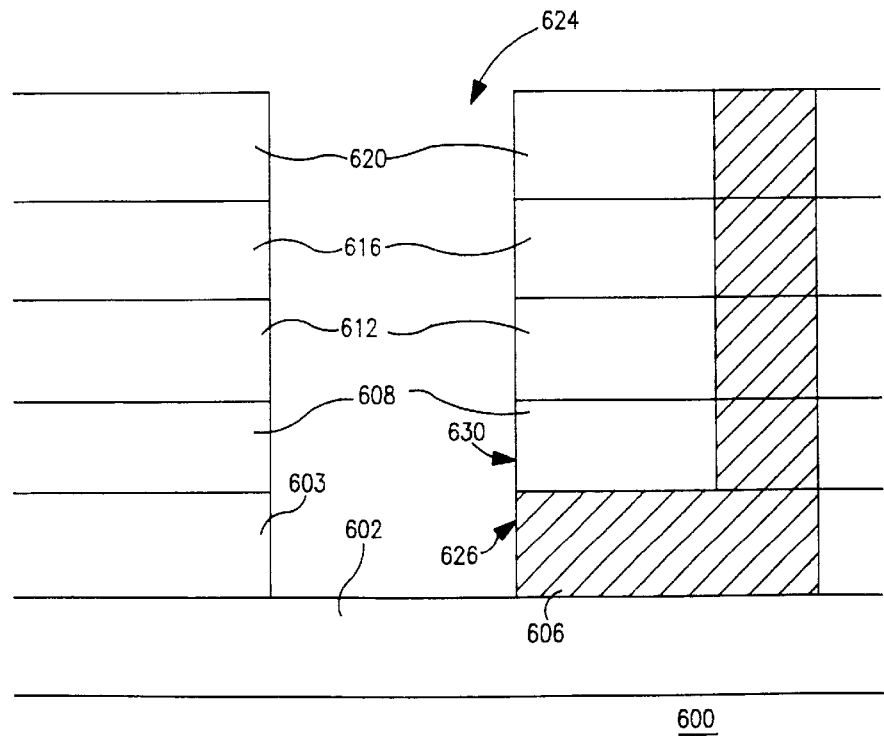

In FIG. 6D, insulation layers 608, 612, 616, and 620 are successively formed as required along with respective contacts 610, 614, 618, and 622. Generally, insulation layers 603, 612, and 620 may have metal embedded within the layers to provide interconnection, for example, between various elements of the device (not shown). Contacts 606, 610, 614, 618, and 622 are in electrical contact with one another. In FIG. 6E, trench 624 is formed in insulation layers 603, 608, 612, 616, and 620. Trench 624 has a bottom surface coincident with a top surface of insulation layer 602, although if desired trench 624 may penetrate into insulation layer 602. A portion of inner surface 630 of trench 624 contacts an end surface 626 of contact 606. By positioning the trench appropriately over layer 606, then layer 628 forming the outer trench electrode may also be in direct contact with the upper surface of 606.

Trench 624 may be etched in insulation layers 603, 608, 612, 616, and 620 by reactive ion etch processes, for example, to allow the capacitor to be formed those layers. The bottom of trench 624 is preferably formed by an etch step in this process. In addition, trench 624 is etched so that the capacitor formed therein does not physically contact substrate 600.

Figure 6F:
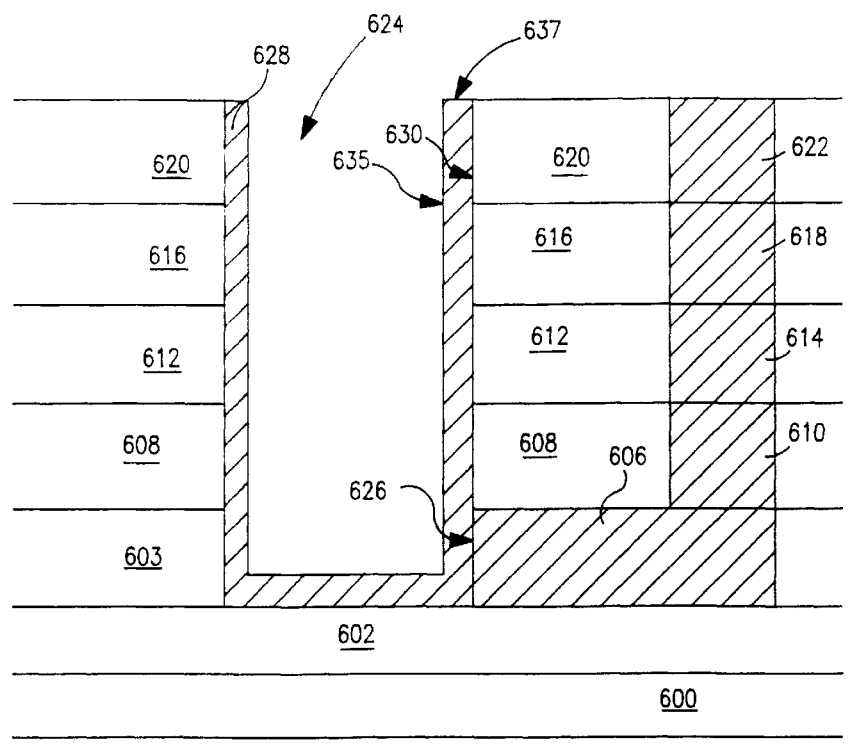
Figure 6G:
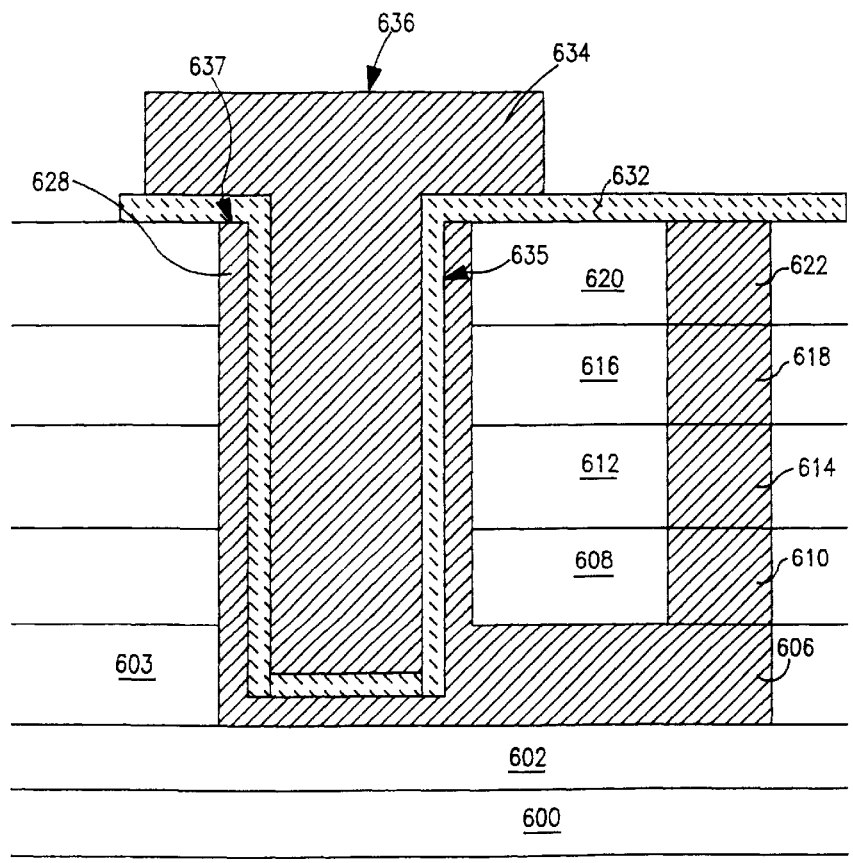

Referring to FIG. 6F, conductive layer 628 is uniformly formed along the inner surface 630 of trench 624 to a desired thickness. Conductive layer 628 forms an electrical contact with metal contact 606. Conductive layer 628 may be formed from any conductive material such as Al, Cu or a refractory metal. In FIG. 6G, capacitor 636 is formed by first uniformly disposing dielectric 632 along inner surface 635 and top surface 637 of metal layer 628 followed by filling the remaining area of trench 624 with conductive material 634. Dielectric 632 may also extend along the surface of insulation layer 620 and contact metal layer 622.

Figure 6H:
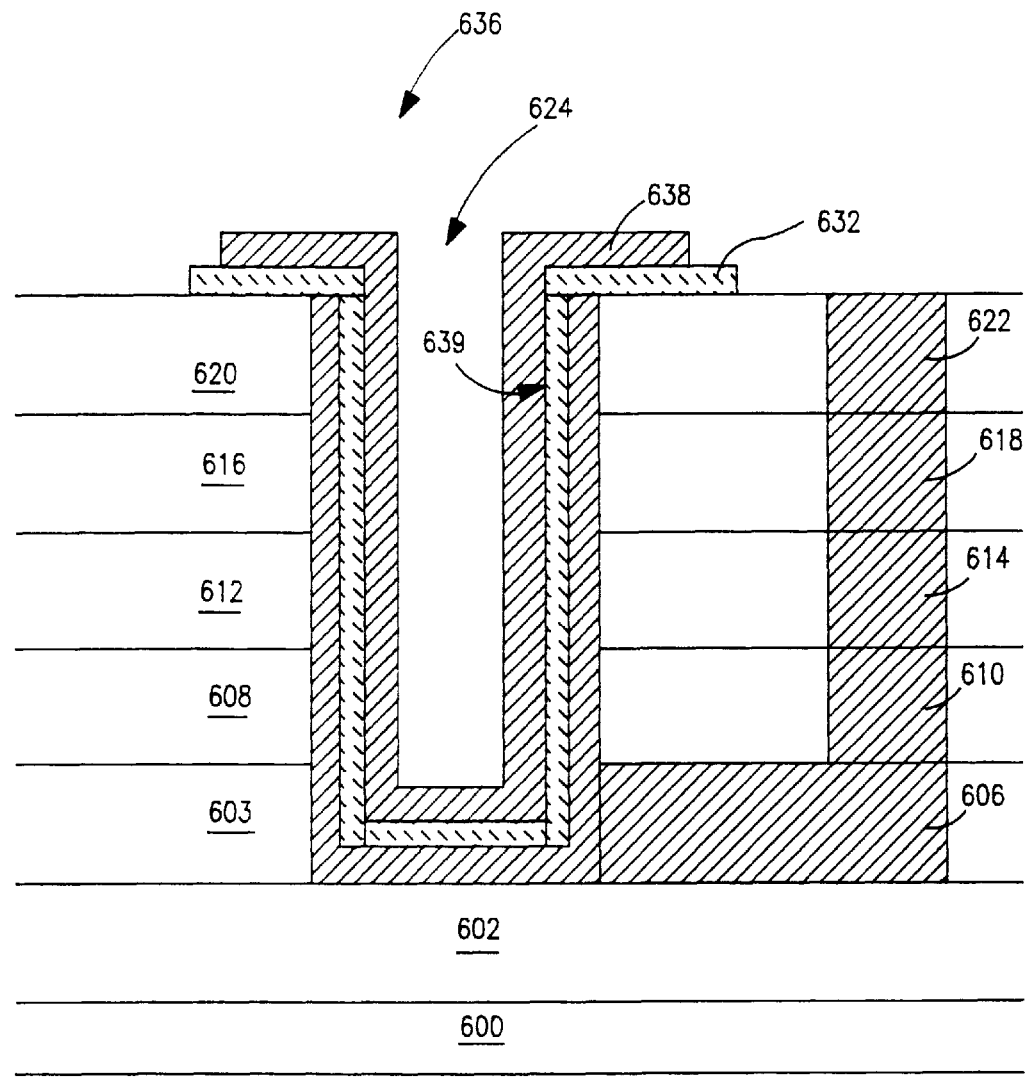

Alternatively, as shown in FIG. 6H, capacitor 636 may be completed by uniformly disposing conductive layer 638 along the inner surface 639 of dielectric 632. The remaining area of trench 624 may then be filled with an insulator (not shown) or other inert material to prevent deterioration of capacitor 636.

Figure 7A:
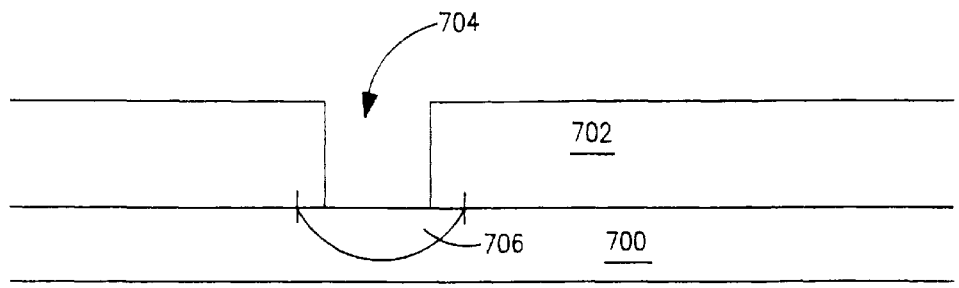
FIGS. 7A–7I show cross sectional views of a capacitor according to a fourth exemplary embodiment of the present invention.

Referring to FIGS. 7A–7F, a fourth exemplary embodiment of a capacitor of the present invention is shown. In FIG. 7A, BEOL insulation layer 702 is formed over substrate 700. Contact area 704 is then formed in insulation layer 702 over substrate 700 to expose a top surface of diffusion 706.

Figure 7B:
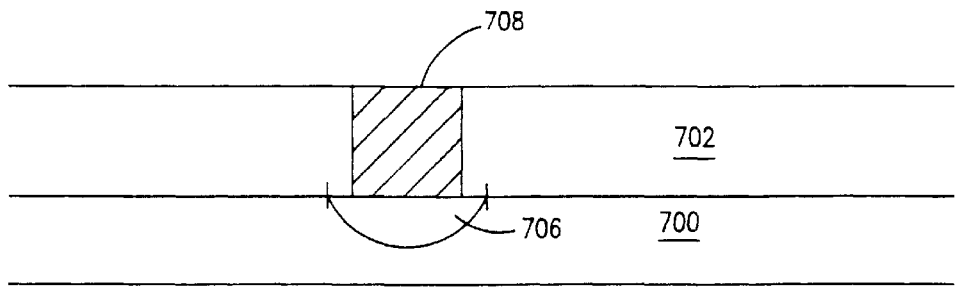
Figure 7C:
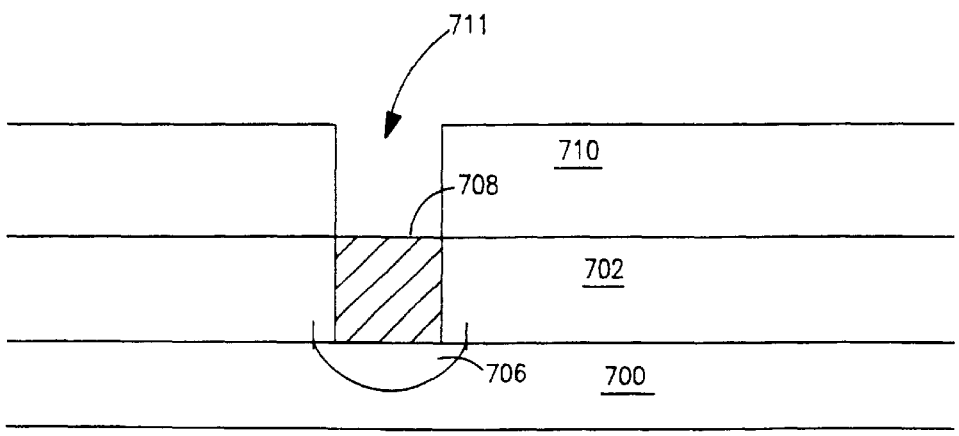

In FIG. 7B, stud 708 is formed in contact area 704 so that stud 708 contacts diffusion 706. Stud 708 is then polished back or planarized so that upper surface 709 of stud 708 is level with upper surface 703 of insulation layer 702. In FIG. 7C, a second insulation layer 710 is formed above insulation layer 702 and stud 708. Another contact area 711 is then formed in insulation layer 710 coincident with stud 708 and exposing the surface of stud 708.

Figure 7D:
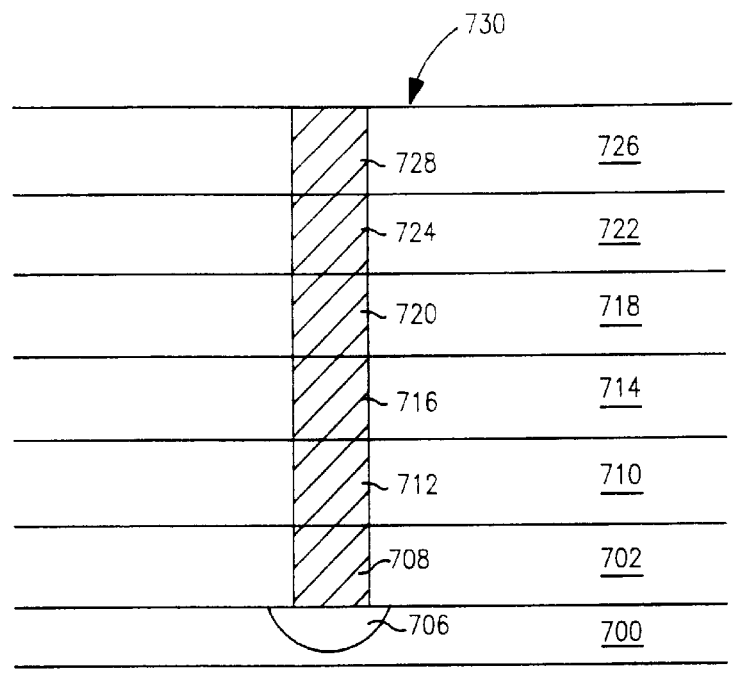

As shown in FIG. 7D, successive insulation layers 710, 714, 718, 722, and 726 as well as respective metal contacts 712, 716, 720, 724, and 728 are formed above insulation layer 702. Metal contacts 712, 720, and 728 may be formed as part of metallization layers which may contain metal lines (not shown) for interconnecting various elements of the device. In addition, metal contacts 716 and 724 may be studs similar to stud 708. Metal contacts 716 and 724 may be formed to interconnect metal contacts 712, 720, and 728. Metal contacts 712, 716, 720, 724, and 728 are in contact with diffusion 706 through stud 708. The number of insulation layers and respective contacts may vary depending upon design considerations of the resulting capacitor. After the last contact is formed in the upper-most insulation layer, the contact is polished back or planarized so that the upper surface of the metal contact is level with the upper surface of the respective insulation layer. It is understood by one of skill in the art that, as each insulation layer and respective metal contact are formed, they are planarized.

Figure 7E:
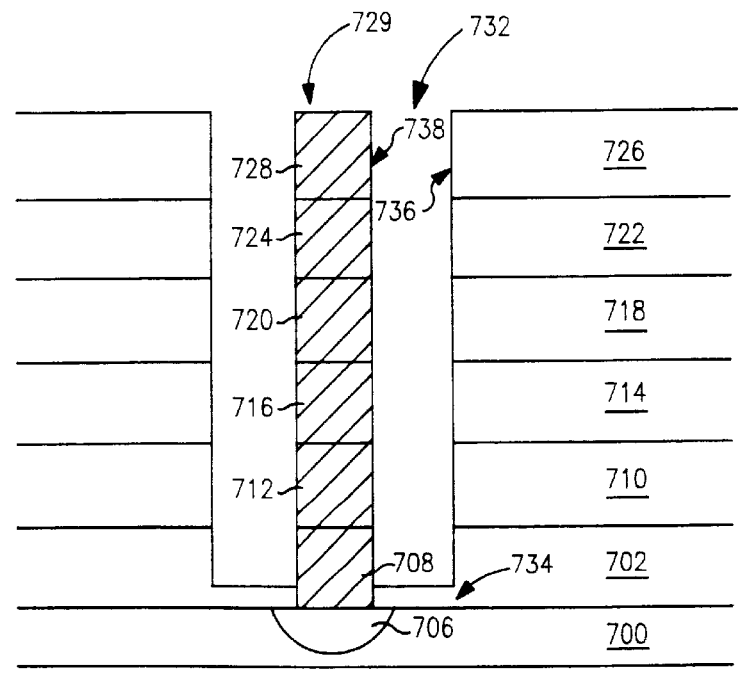
Figure 7F:
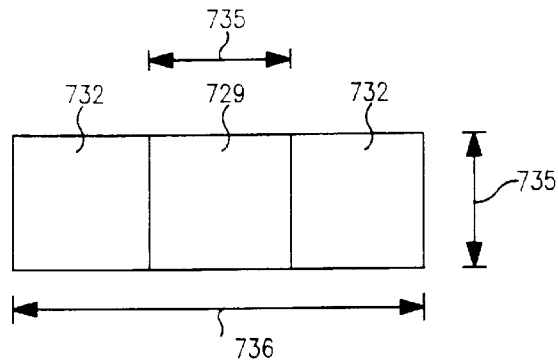

As shown in FIG. 7E, trench 732 is formed around stud 708 and contacts 712, 716, 720, 724, and 728 (collectively column 729). The depth of trench 732 is controlled so that the bottom of trench 732 does not contact diffusion 706, by leaving a portion 734 of insulation layer 702 intact. The shape of trench 732 may be rectangular, circular, or any other shape as desired. In addition, trench 732 may surround stud 708 and column 729 or expose only a portion of stud 708 and column 729. Referring to FIG. 7F, trench 732 is formed on two sides of column 729. In this example, column 729 is in the form of a square, although any other form, such as a rectangle or circle may be used. The minimum dimension 735 of column 729 is 1F, where F is the minimum lithographic dimension. The overall dimension 736 of trench 732 and column 729 is greater than the minimum lithographic dimension F.

Figure 7G:
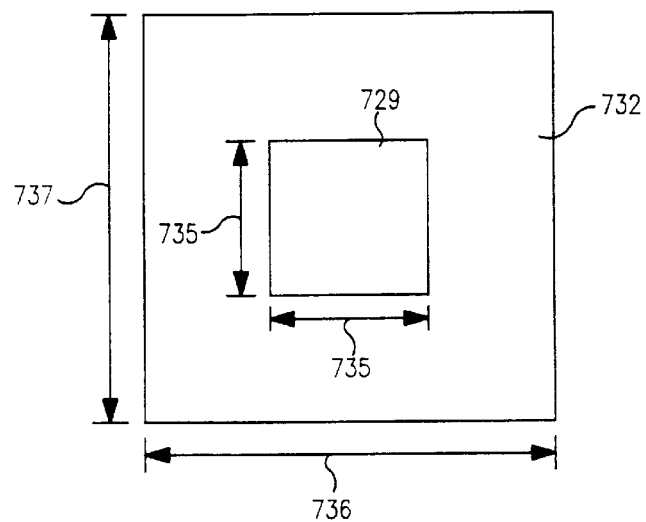
Figure 7H:
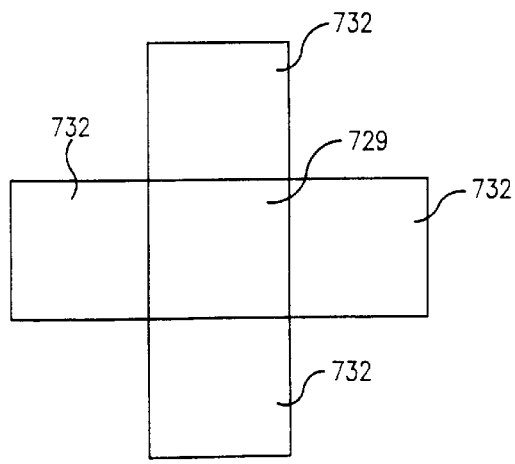

Referring to FIG. 7G, an example is shown where trench 732 is formed to completely surround column 729. As was shown in FIG. 7F, column 729 has a dimension 735 of at least the minimum lithographic dimension F. Dimensions 736 and 737 of trench 732 are greater than the minimum lithographic dimension F and are not necessarily equal to one another. Finally, referring to FIG. 7H, an example is shown where trench 732 is formed as four individual trenches contacting each side of column 729.

Figure 7I:
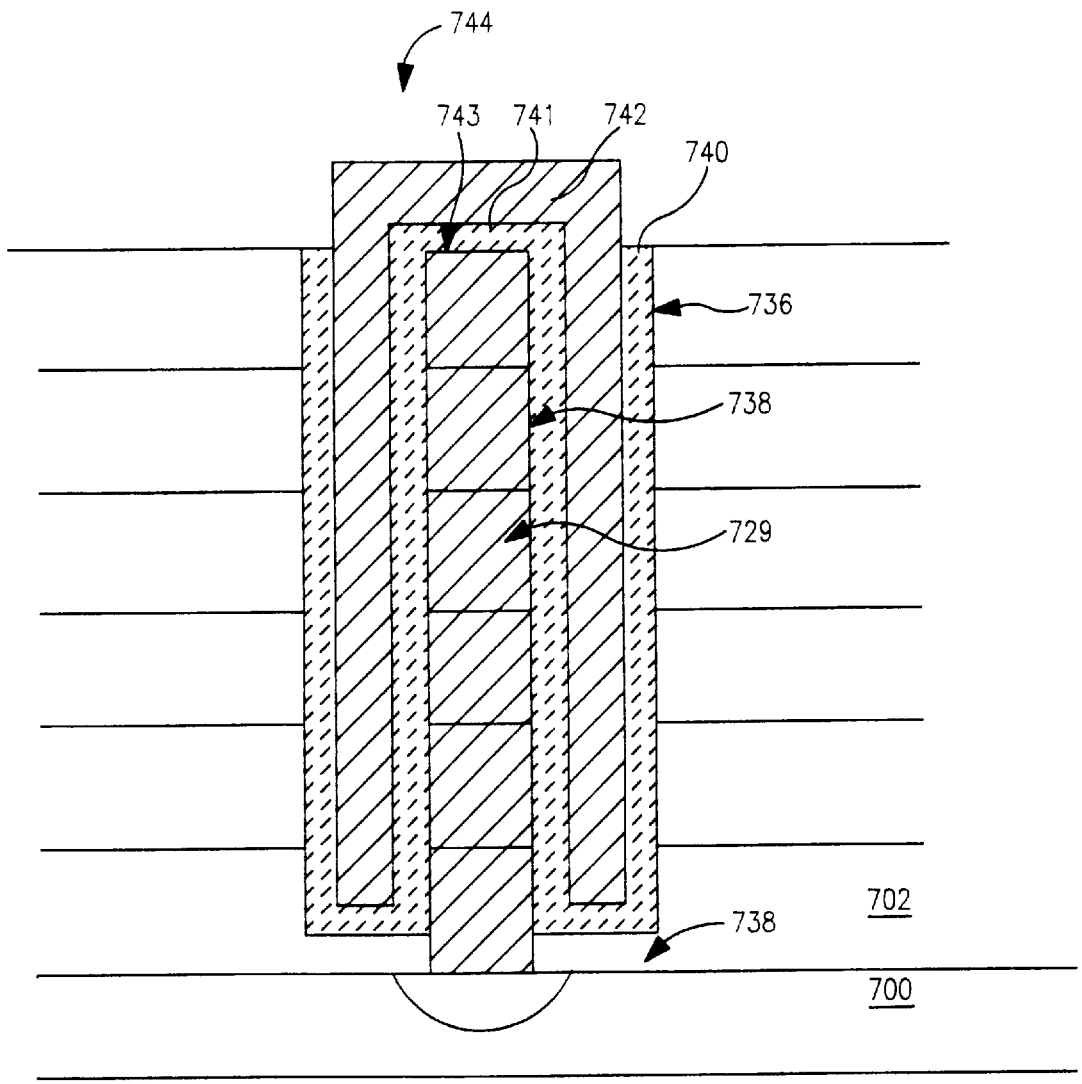

Referring to FIG. 7I, dielectric 740 is formed along inner surface 736 of trench 732. Another dielectric 741 is formed along outer surface 738 and top surface 743 of column 729. Conductor 742 is then disposed within the remaining area of trench 732 and in contact with the surface of dielectrics 740 and 741. The combination of column 729, contact 742, and dielectrics 740 and 741 forms capacitor 744.

Figure 8A:
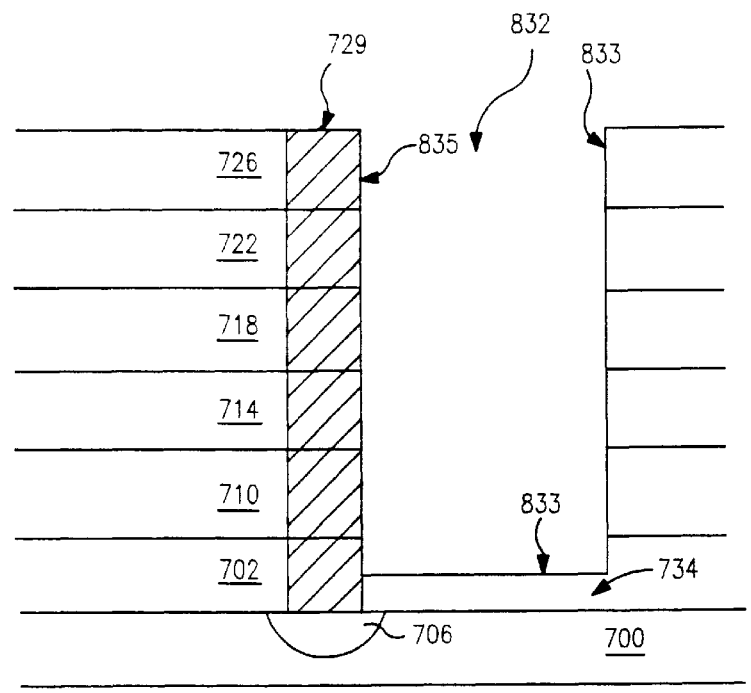
FIGS. 8A–8D show cross sectional views of a capacitor according to a fifth exemplary embodiment of the present invention.

Referring now to FIGS. 8A–8D, a fifth exemplary embodiment of the present invention is shown. This embodiment is different from the fourth exemplary embodiment in that the capacitor is formed along one side of column 729. The steps leading up to the formation of column 729 are identical to the fourth exemplary embodiment and, therefore, the accompanying explanation is not repeated here. In FIG. 8A, trench 832 is formed along one side of conductive column 729 such that the bottom of trench 832 does not contact diffusion 706, by leaving intact portion 734 of insulation layer 702.

Figure 8B:
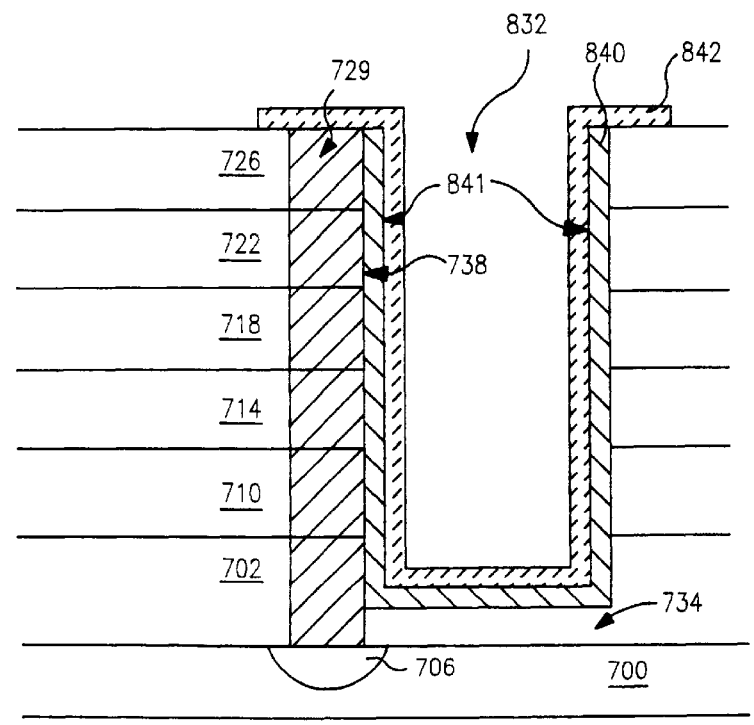
Figure 8C:
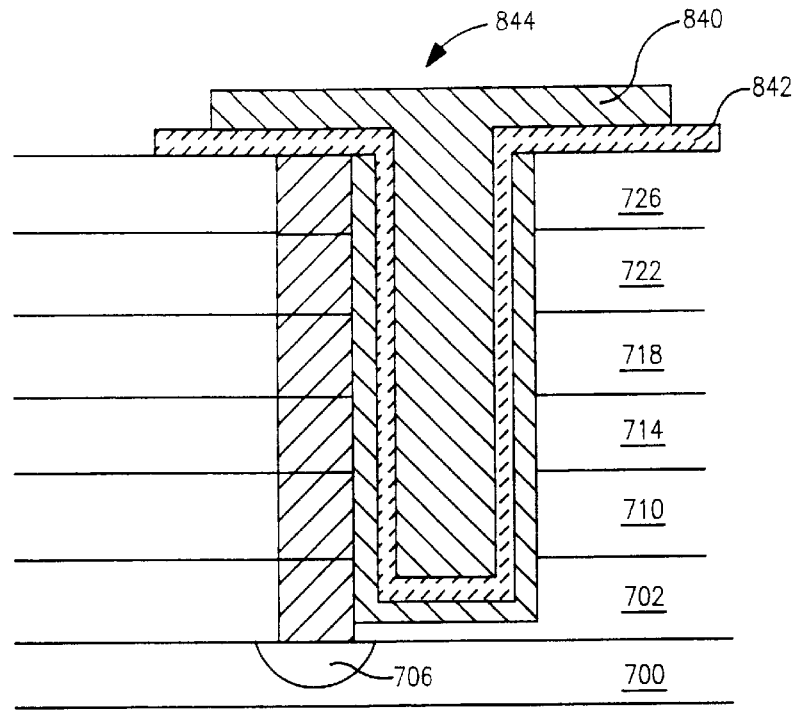

In FIG. 8B, conductor 840 is uniformly formed along wall 833 of trench 832 and wall 835 of column 729. Dielectric 842 is then uniformly formed along exposed surfaces 841 and 738 of conductor 840 and column 729 respectively. In FIG. 8C, capacitor 844 is formed by disposing conductor 840 within the remaining area of trench 832. Conductor 840 may also be disposed, if desired, along the upper exposed surfaces of dielectric 842.

Figure 8D:
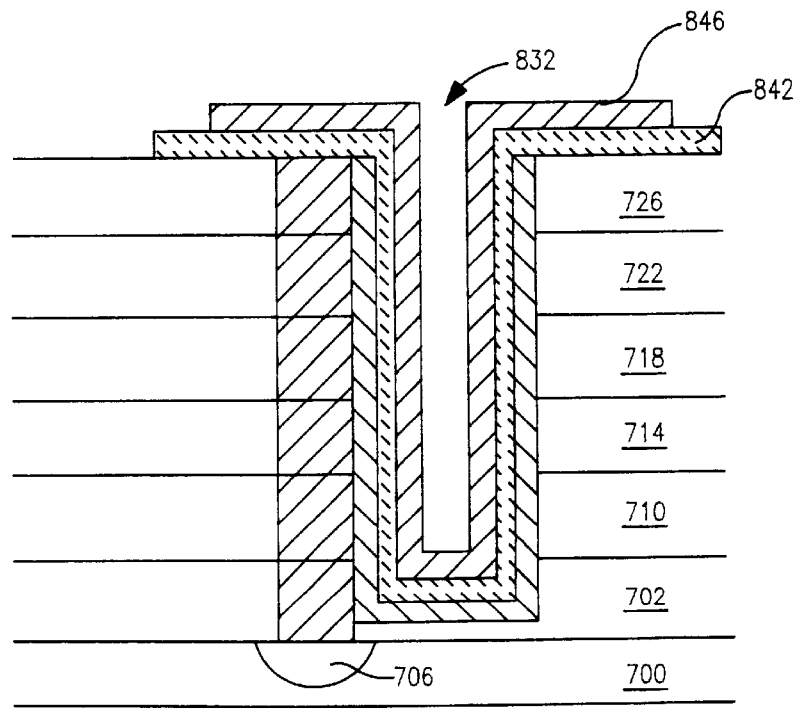

Referring to FIG. 8D, an alternative of the fifth exemplary embodiment is shown. In FIG. 8D, conductor 846 is uniformly formed along the surfaces of dielectric 842. The remaining area of trench 832 may be filled with a non-conductive material if desired.

Figure 9A:
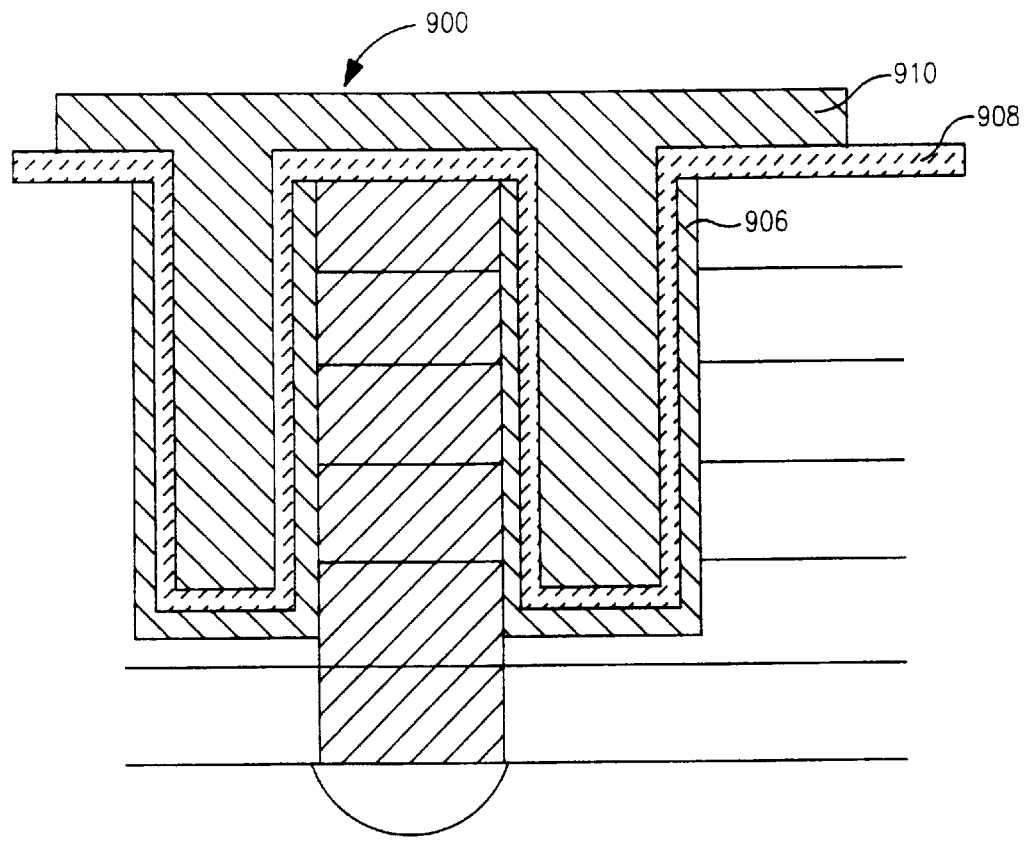
FIGS. 9A–9B show views of a capacitor according to a sixth exemplary embodiment of the present invention.
Figure 9B:
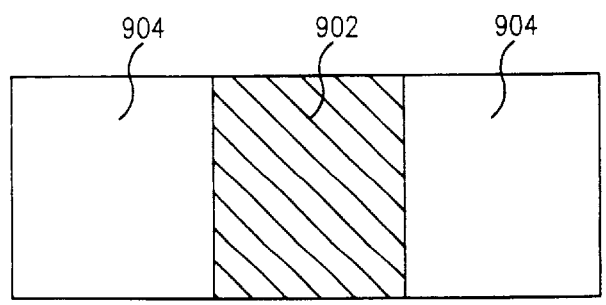

In FIG. 9A, a sixth exemplary embodiment of the present invention is shown. In FIG. 9A, capacitor 900 is created by forming a trench 904 along both sides of column 902, as shown in FIG. 9B, and then uniformly disposing conductor 906 along the walls of trench 904 and the exposed portions of column 902. This is followed by the disposition of dielectric 908 along the exposed portions of conductor 906 and the disposition of conductor 910 within the remaining portions of trench 904. If desired, conductor 910 may also be disposed along the upper surfaces of dielectric 908.

Figure 10A:
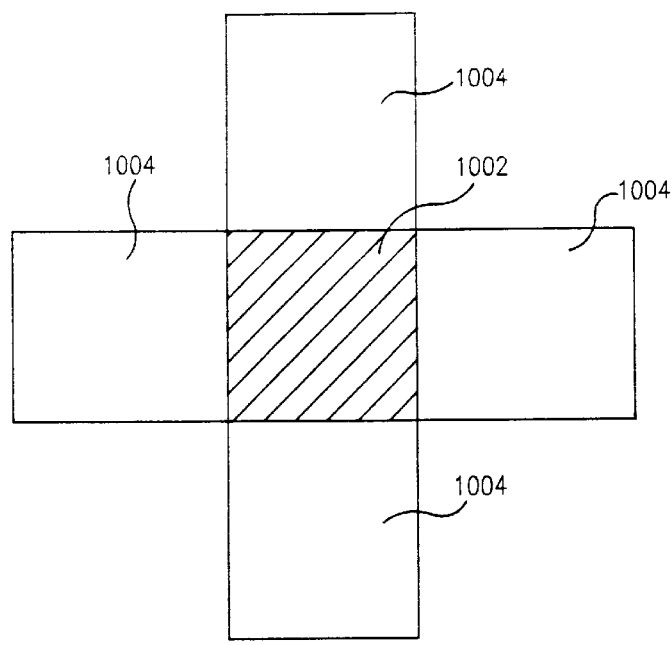
FIGS. 10A–10B show views of a capacitor according to a seventh exemplary embodiment of the present invention.
Figure 10B:
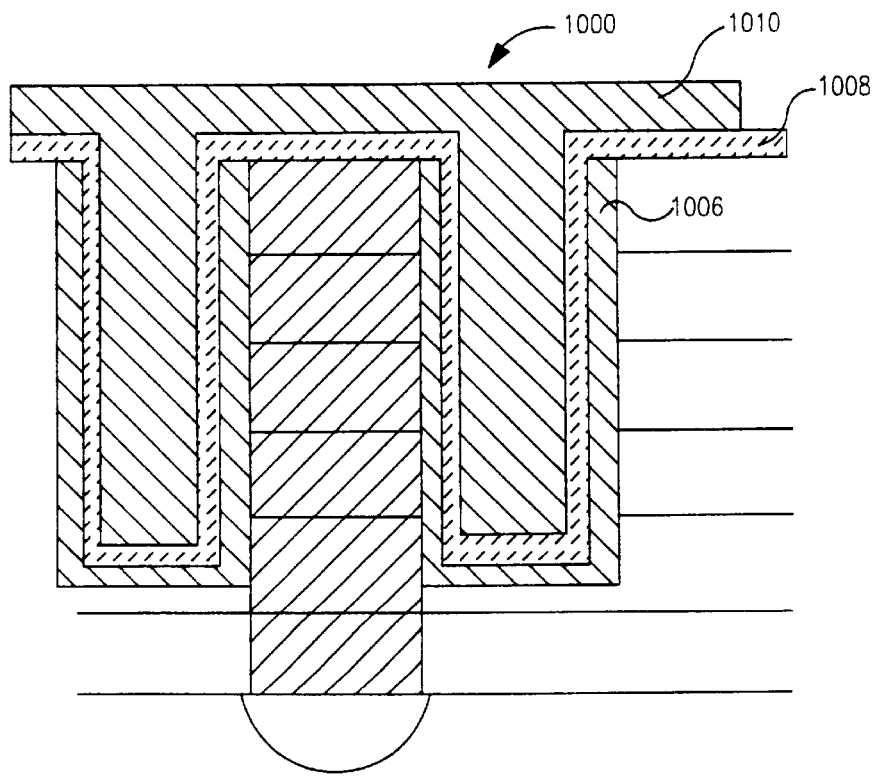

Referring to FIGS. 10A and 10B, a seventh exemplary embodiment of the trench capacitor of the present invention is illustrated. In FIG. 10A, trench 1004 is formed along each side of column 1002. In this exemplary embodiment, column 1002 has a rectangular shape for illustrative purposes only. Therefore, trench 1004 is formed along the four sides of column 1002. If column 1002 is triangular shaped, for example, trench 1004 could be formed along the three sides of column 1002. As shown in FIG. 10B, capacitor 1000 is formed by disposing, in succession, conductor 1006, dielectric 1008, and conductor 1010, within trench 1004.

A trench capacitor fabricated according to the above processes, may have a minimum lithographic dimension of 1F by 1F, where F is the minimum lithographic feature. The process is not limited to this dimension, however, and may have other minimum dimensions.

Figure 11A:
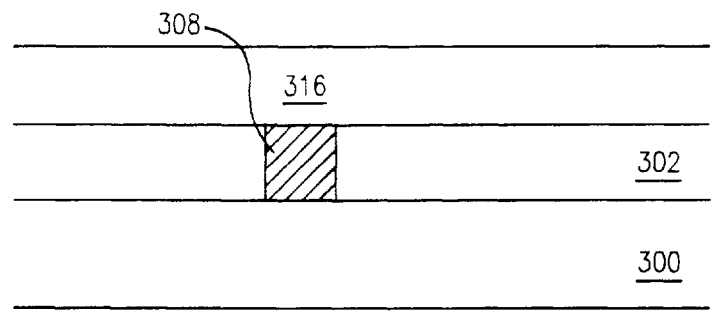
FIGS. 11A–11O show cross sectional views of a capacitor formed according to an eighth exemplary embodiment of the present invention.

FIGS. 11A–11O are cross sectional views of a planarized interleaved capacitor constructed in accordance with an eighth exemplary embodiment of the present invention. This capacitor is similar to the capacitor according to the first exemplary embodiment with respect to FIGS. 3A–3C. Therefore, the description of these figures will not be repeated.

Figure 11B:
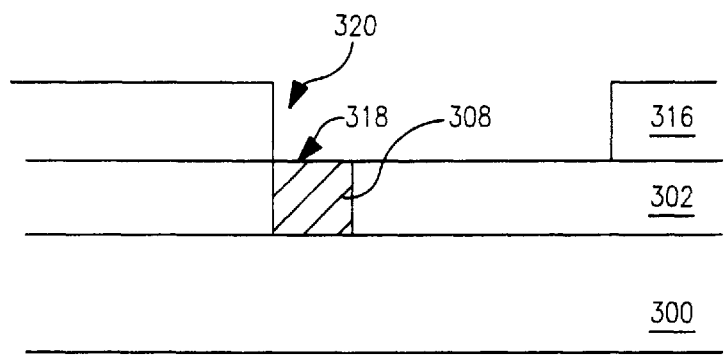

Referring to FIG. 11A, insulator 316 is disposed over insulator 302 and metal stud 308. In FIG. 11B, opening 320 is formed in insulator 316 to expose surface 318 of metal stud 308 and a portion of the surface of insulator 102. As mentioned above, lithographic etching or other methods may be used to form openings in the materials used in the exemplary embodiment.

Figure 11C:
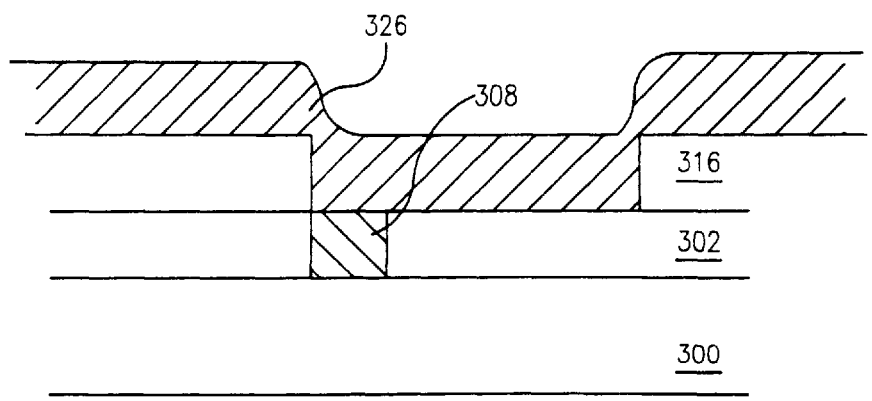

Referring to FIG. 11C, metal 326 is disposed over insulator 316, insulator 302, and metal stud 308. Metal 326 forms an electrical contact with metal stud 308.

Figure 11D:
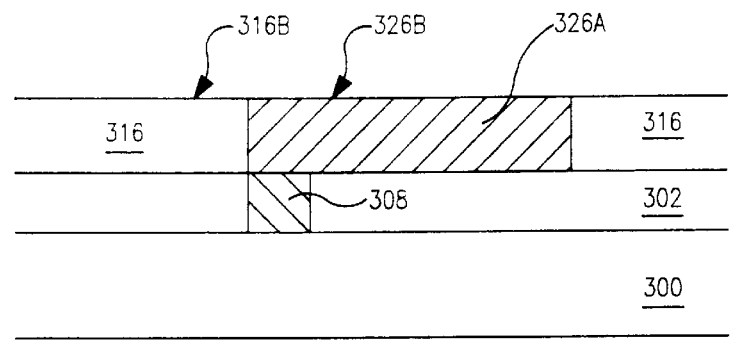

In FIG. 11D, metal 326 is polished back or planarized to form metal level 326A. As mentioned above, RIE, chemical polishing, or mechanical polishing may be used to planarize elements of the capacitor, although other techniques may be used as desired. When metal 326 is planarized, a top surface 326B of metal level 326A will be planar with top surface 316B of insulator 316.

Figure 11E:
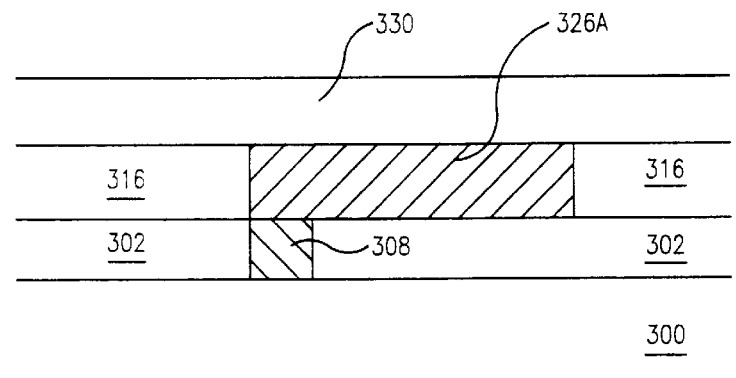
Figure 11F:
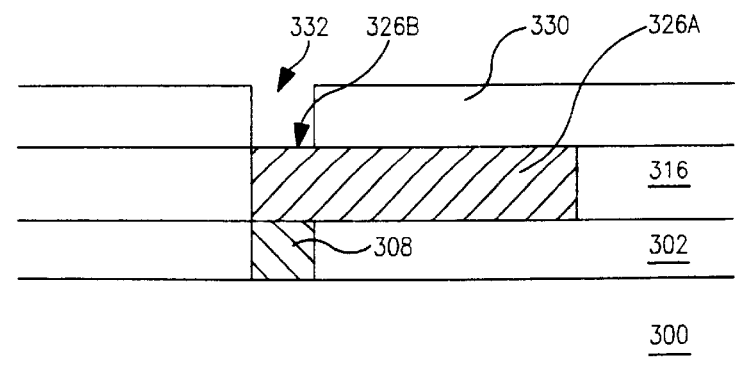

Referring to FIG. 11E, insulator 330 is disposed over insulator 316 and metal layer 326A and planarized. In FIG. 11F, opening 332 is formed in insulator 330 to expose surface 326B of metal level 326A.

Figure 11G:
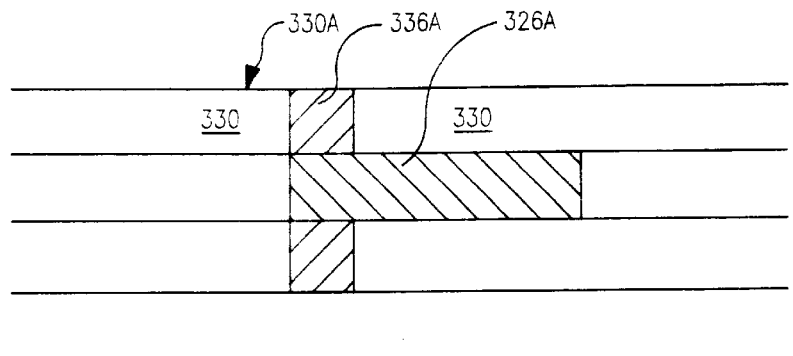

Referring to FIG. 11G, metal level 336A is formed over metal level 326A by disposing metal in opening 332 followed by planarizing the metal to the surface 330A of insulator 330. Metal level 336A is in contact with metal level 326A. In this way metal level 336A serves the purpose of maintaining electrical integrity between odd numbered metal levels.

Figure 11H:
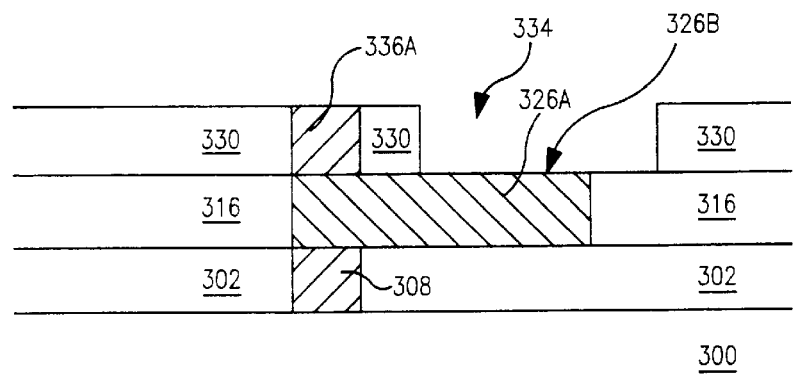

As shown in FIG. 11H, opening 334 is formed in insulator 330 to expose top surface 326B of another portion of metal level 326A. A portion of insulator 330 isolates opening 334 from metal level 336A.

Figure 11I:
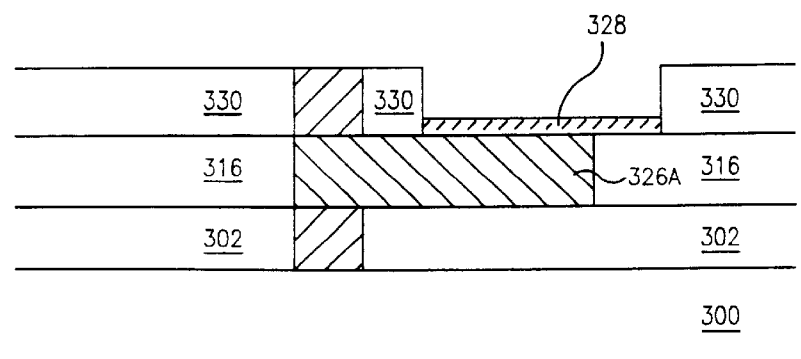

In FIG. 11I, dielectric 328 is thinly disposed over metal level 326A and a portion of insulator 316. Dielectric 328 may also be disposed over insulator 330 in the process. In this case the excess portion (the portion disposed over insulator 330) is removed by RIE, chemical polishing, mechanical polishing, or photolithography and etch, for example.

Figure 11J:
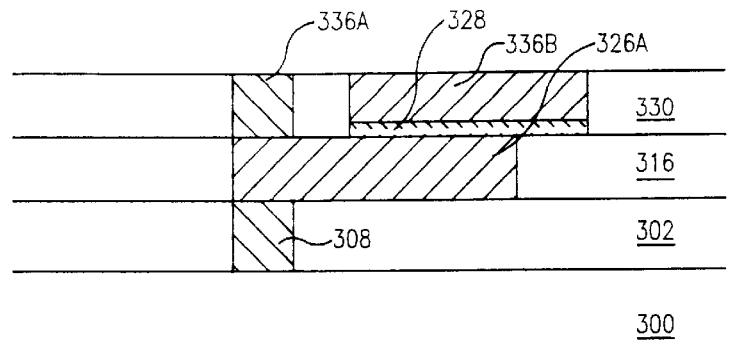

Referring now to FIG. 11J, metal level 336B is formed over dielectric layer 328 and planarized. In this way a capacitive element is formed between metal levels 336A and 336B and dielectric layer 328.

Figure 11K:
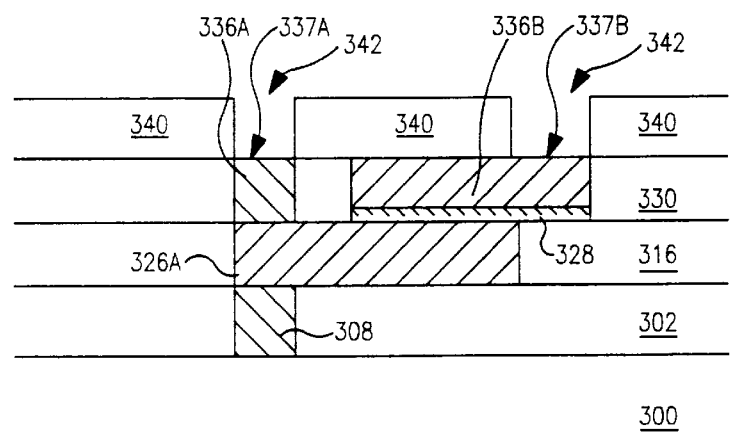

Referring to FIG. 11K, insulator 340 is disposed over dielectric 338 and planarized. Openings 342 are then formed in insulator 340 to expose surface 337A and 337B of metal level 336A, 336B, respectively.

Figure 11L:
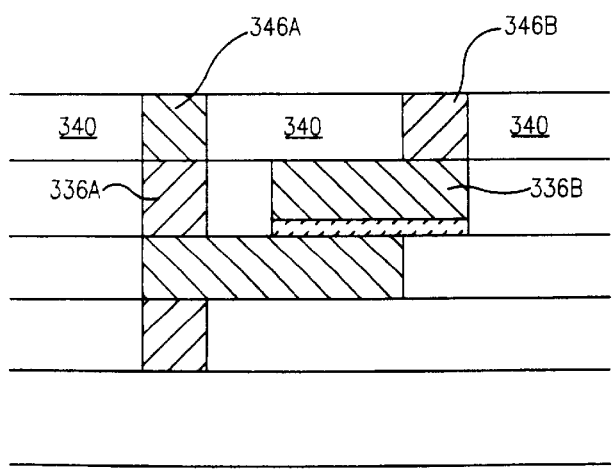
Figure 11M:
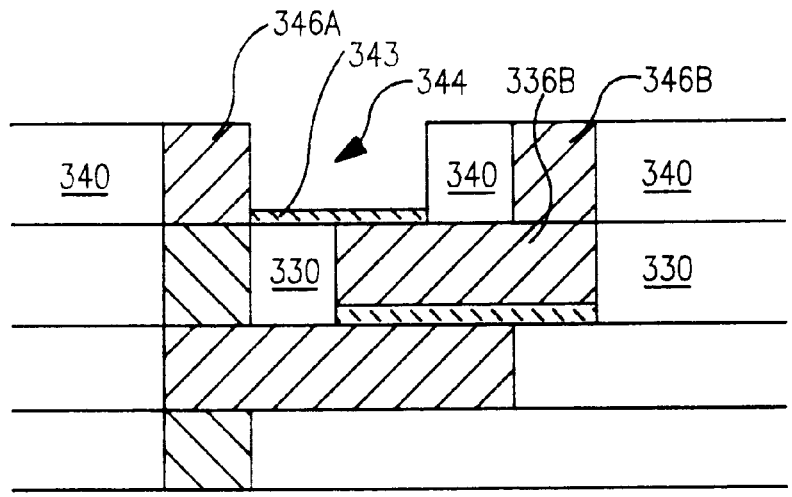

In FIG. 11L, metal levels 346A and 346B are formed over metal level 336A and 336B, respectively, by disposing metal in openings 342. Referring to FIG. 11M, an additional opening 344 is formed in insulator 340 adjacent metal level 346A. Dielectric 348 is then disposed in opening 344 similar to dielectric 328 as shown in FIG. 11I. As mentioned above, each succeeding metal level provides electrical integrity of lower metal levels while forming an opposing plate of the capacitor.

Figure 11N:
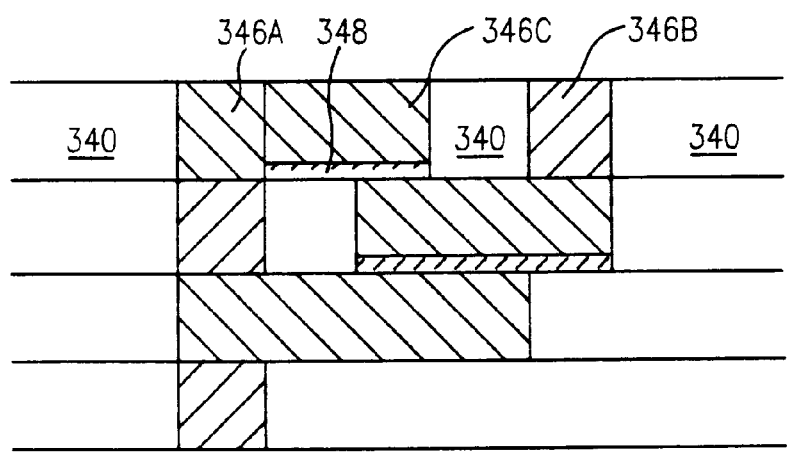
Figure 110:
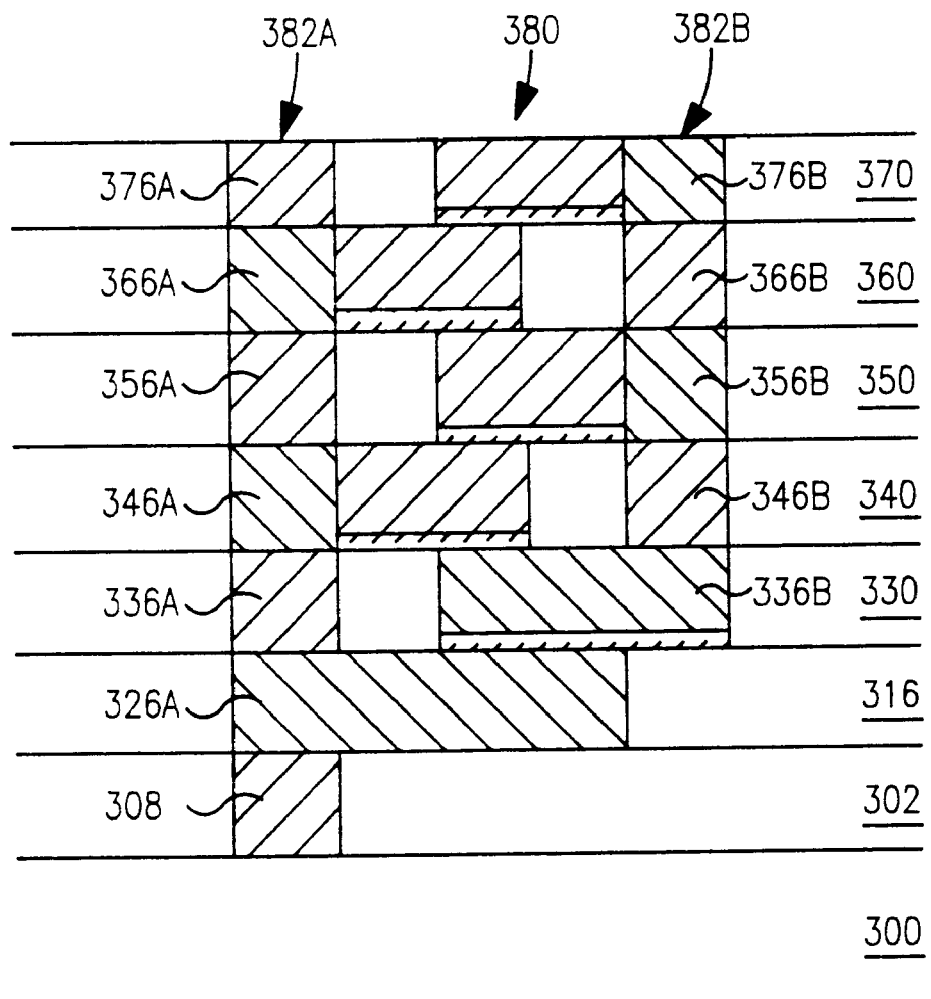

In FIG. 11N, metal level 346C is formed over dielectric layer 348 and in electrical contact with metal level 346A. Metal level 346C is insulated from metal level 346B by insulator 340.

As shown in FIG. 11O, the procedure outlined in FIGS. 11A–11N, above, may be repeated to form as many levels as necessary in order to provide a capacitor having a desired characteristic. As shown in FIG. 11O, the metal levels 308, 326A, 336A, 346A, 356A, 366A and 376A are connected to one another and form one side of capacitor 380. Metal level 336B, 346B, 356B, 366B and 376B are interconnected to one another and form the other side of capacitor 380. Connection to other devices may be made at any metal level and/or at the top 382A, 382B of capacitor 380. In addition, a circuit within substrate 300 (not shown) may be connected to metal stud 308 if desired by coupling metal stud 308 to the circuit.

Figure 12A:
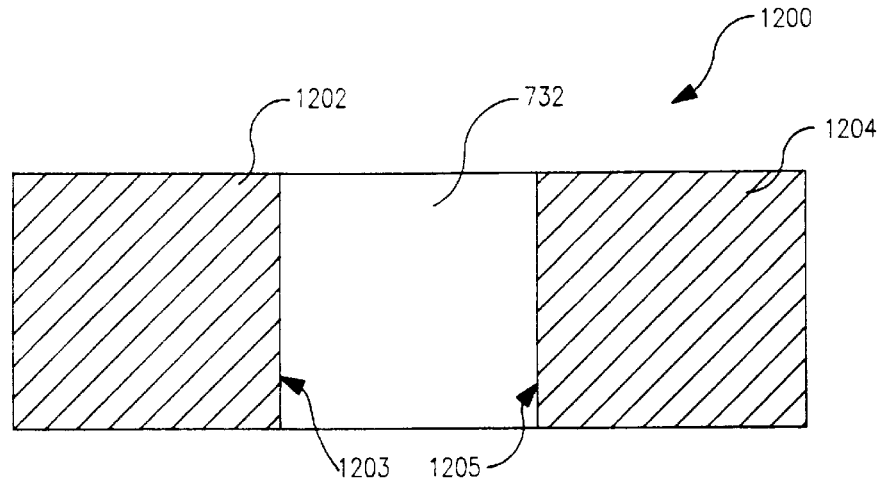
FIGS. 12A–12C show views of a capacitor according to a ninth exemplary embodiment of the present invention.
Figure 12B:
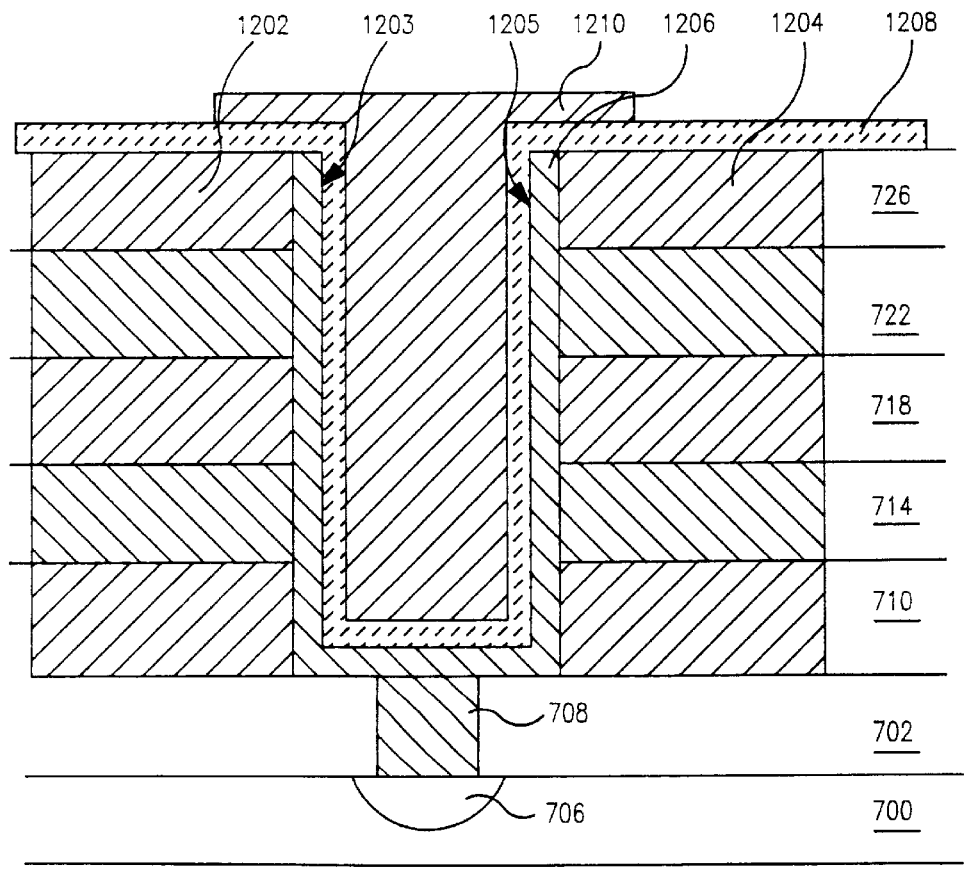
Figure 12C:
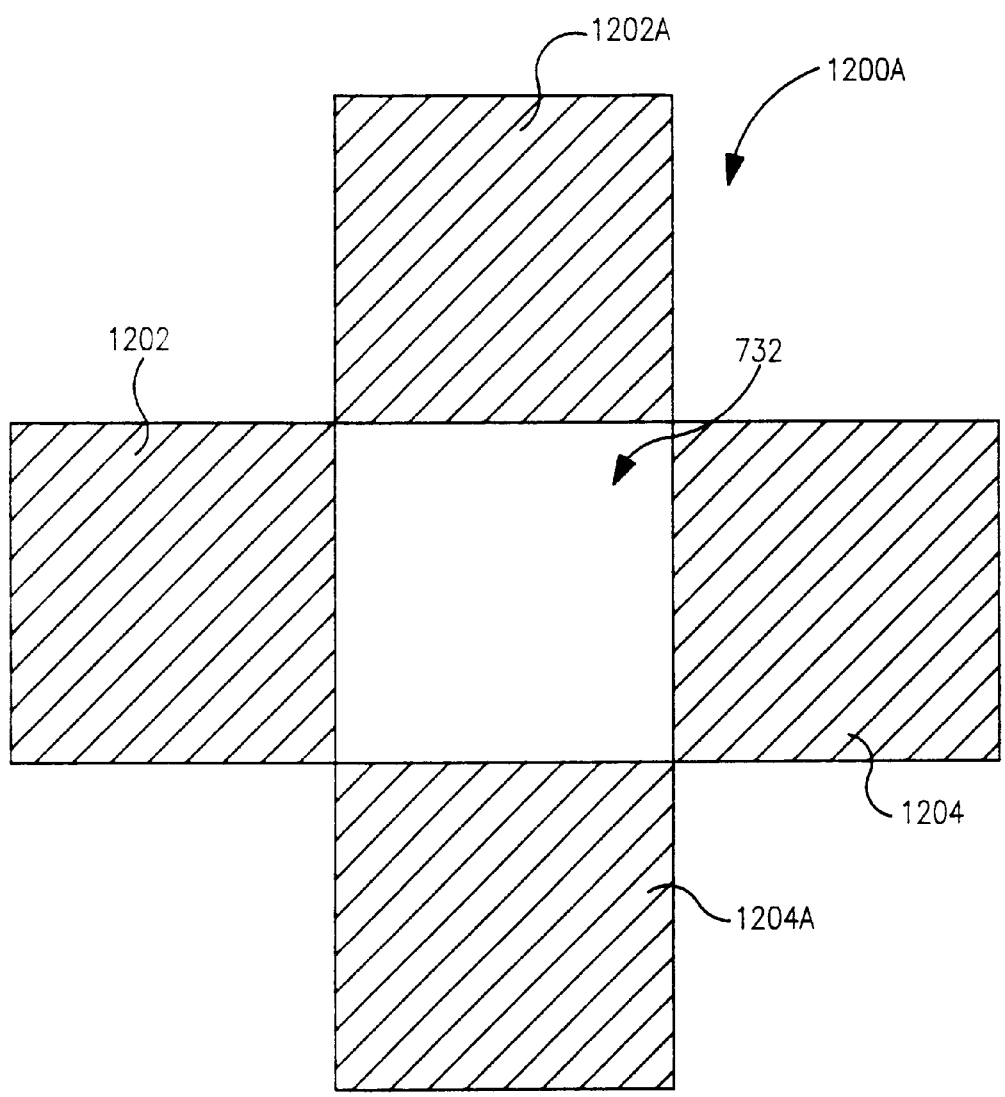

Referring now to FIGS. 12A–12C, a ninth exemplary embodiment of the present invention is shown. In FIG. 12A, a top view of capacitor 1200 is shown. This embodiment differs from the fourth exemplary embodiment in that the capacitor is formed along a side of columns 1202 and 1204. The steps leading up to the formation of columns 1202, 1204 are identical to the fourth exemplary embodiment and, therefore, the accompanying explanation is not repeated here.

In FIG. 12B, trench 732 is formed along one side of conductive columns 1202, 1204 such that the bottom of trench 832 does not contact diffusion 706, by leaving intact at least a portion of insulation layer 702. Conductor 1206 is uniformly formed along walls 1203, 1205 of conductive columns 1202, 1204, respectively and the bottom portion of trench 732. Dielectric 1208 is then uniformly formed along exposed surfaces of conductor 1206. Dielectric 1208 may also be formed, if desired, along the top surface of conductive columns 1202, 1204. Capacitor 1200 is formed by disposing conductor 1210 within the remaining area of trench 732. Conductor 840 may also be disposed, if desired, along at least a portion of the upper exposed surfaces of dielectric 1208.

Referring to FIG. 12C, an alternative of the ninth exemplary embodiment is shown. In FIG. 12C, a top view of capacitor 1200A is shown. This embodiment differs form the ninth embodiment in that four conductive columns 1202, 1202A, 1204, 1204A are formed in the insulation layers and trench 732 is formed between the four conductive columns 1202, 1202A, 1204, 1204A. Conductor 1206 is uniformly formed along the exposed surfaces of conductive columns 1202, 1202A, 1204, 1204A. The remaining steps are similar to those mentioned in the ninth embodiment and are not repeated here.

Although preferred embodiments of the invention have been shown and described, it will be understood that such embodiments are provided by way of example only. Numerous variations, changes, and substitutions will occur to those skilled in the art without departing from the spirit of the invention. Accordingly, it is intended that the appended claims cover all such variations as fall within the spirit and scope of the invention.

What is claimed:

1. A capacitor fabricated over a substrate comprising:
   at least one insulation layer disposed over the substrate;
   a trench formed in the at least one insulation layer;
   a first electrode formed along an interior surface of the trench, the first electrode not physically contacting the substrate;
   a dielectric disposed along at least an interior surface of the first electrode; and
   a second electrode disposed along at least a portion of the dielectric,
   wherein the first electrode is formed at a uniform thickness along the interior surface of the trench.

2. A capacitor structure formed over a substrate, the capacitor comprising:
   a trench formed over the substrate;
   an inner electrode disposed in the trench, the inner electrode having:
   i) a plurality of metal layers, and
   ii) a plurality of metal contacts coupled to respective ones of the plurality of metal layers;
   a dielectric partially surrounding the inner electrode; and
   to an outer electrode partially surrounding the dielectric.

3. A trench capacitor for use with a substrate comprising:
   an insulator disposed over a surface of the substrate;
   an orifice formed within the insulator having a bottom portion above the surface of the substrate;
   a first metal layer disposed along a surface of the orifice;
   a dielectric disposed along a surface of the first metal layer; and
   a second metal disposed along a surface of the dielectric.

4. A trench capacitor according to claim 3, further comprising:
   a second orifice formed from the bottom portion of the insulator to the surface of the substrate; and
   a third metal disposed within the second orifice and coupled to the surface of the substrate and the first metal layer.

5. A trench capacitor for use with a substrate comprising:
   an insulator disposed over a surface of the substrate;

a first metal formed within the insulator;

an orifice formed within the insulator and exposing at least a portion of the first metal, the orifice having a bottom portion above the surface of the substrate;

a dielectric disposed along at least a surface of the first metal and a portion of the orifice; and a second metal disposed along a surface of the dielectric.

6. A trench capacitor according to claim 5, wherein the first metal is coupled to the surface of the substrate.

7. A trench capacitor for use with a substrate comprising:

an insulator disposed over a surface of the substrate;

a first metal formed within the insulator;

a second metal formed within the insulator;

an orifice formed within the insulator and exposing at least a portion of the first metal and the second metal, the orifice having a bottom portion above the surface of the substrate;

a dielectric disposed along i) at least a surface of the first metal, ii) a portion of the second metal, and iii) a portion of the orifice; and a third metal disposed at least along a surface of the dielectric.

8. A trench capacitor according to claim 7, wherein the at least one of the first metal and the second metal is coupled to the surface of the substrate.

9. A trench capacitor for use with a substrate comprising:

an insulator disposed over a surface of the substrate;

at least two stacked metal studs or metal layers formed within the insulator;

an orifice formed within the insulator and between the at least two metal studs or layers, and exposing at least a portion of the at least two metal studs or layers, the orifice having a bottom portion above the surface of the substrate;

a dielectric disposed along at least a surface of the at least two metal studs or layers and a portion of the orifice; and a further metal disposed at least along a surface of the dielectric.

10. A trench capacitor according to claim 9, wherein the at least one of the at least two metal studs or layers is coupled to the surface of the substrate.

11. A trench capacitor according to claim 9, wherein the at least two metal studs or layers are coupled to one another.

* * * * *